US008295059B1

(12) United States Patent
Conroy

(10) Patent No.: US 8,295,059 B1

(45) Date of Patent: Oct. 23, 2012

(54) TRAFFIC CONTROL EXPANSION AND TESTING SYSTEMS

(76) Inventor: William J. Conroy, Peoria, AZ (US)

( * ) Notice: Subject to any disclaimer, the term of this patent is extended or adjusted under 35 U.S.C. 154(b) by 429 days.

(21) Appl. No.: 12/711,142

(22) Filed: Feb. 23, 2010

Related U.S. Application Data

(60) Provisional application No. 61/218,341, filed on Jun. 18, 2009, provisional application No. 61/159,056, filed on Mar. 10, 2009.

(51) Int. Cl.
*H05K 7/14* (2006.01)
*H05K 7/18* (2006.01)

(52) U.S. Cl. ......................... 361/796; 361/803; 361/737

(58) Field of Classification Search .......... 361/727–730, 361/752, 796, 800–803, 807, 737; 312/223.1, 312/223.2
See application file for complete search history.

(56) References Cited

U.S. PATENT DOCUMENTS 4,164,362 A 8/1979 Cobaugh et al.
4,334,261 A 6/1982 Gonzales
4,401,351 A 8/1983 Record
4,754,397 A 6/1988 Varaiya et al.
4,964,810 A * 10/1990 Malotke et al. ............... 439/368
5,410,717 A 4/1995 Floro
5,428,535 A * 6/1995 Katsumata et al. ............. 701/36
5,761,033 A 6/1998 Wilhelm
6,052,278 A 4/2000 Tanzer et al.
6,067,233 A * 5/2000 English et al. ................ 361/724
6,076,124 A 6/2000 Korowitz et al.
6,434,018 B1 8/2002 Waltz
6,498,731 B1 12/2002 Roscoe et al.
6,721,176 B2 4/2004 Kwong et al.
7,236,370 B2 * 6/2007 Coglitore et al. ............. 361/724
7,265,968 B2 * 9/2007 Champion et al. ........ 361/679.01
7,948,196 B2 * 5/2011 Begun et al. .................. 318/471
2004/0252453 A1 * 12/2004 Brooks et al. ................. 361/687
2004/0261517 A1 12/2004 Koehler et al.

* cited by examiner

*Primary Examiner* — Hung S Bui

(74) *Attorney, Agent, or Firm* — Stoneman Law Patent Group; Martin L. Stoneman; Kyle Liudahl

(57) ABSTRACT

A system relating to improved traffic-control hardware expansion and component testing. More particularly, this invention relates to providing systems for efficient expansion and portable testing of NEMA-standard TS-1 and TS-2 traffic-control devices used in traffic-control applications. The system is especially useful in extending the service life of "aging" fixed-size traffic-control cabinets, within existing traffic-control networks.

27 Claims, 17 Drawing Sheets

TRAFFIC CONTROL EXPANSION AND TESTING SYSTEMS

CROSS-REFERENCE TO RELATED APPLICATION

The present application is related to and claims priority from prior provisional application Ser. No. 61/218,341, filed Jun. 18, 2009, entitled "TRAFFIC CONTROL EXPANSION AND TESTING SYSTEMS", and is also related to and claims priority from prior provisional application Ser. No. 61/159,056, filed Mar. 10, 2009, entitled "PORTABLE CARD RACK TESTING SYSTEMS", the contents of which are incorporated herein by this reference and are not admitted to be prior art with respect to the present invention by the mention in this cross-reference section.

BACKGROUND

This invention relates to traffic control expansion and testing systems. More specifically, this invention relates to extending the service life of "aging" fixed-size traffic-control cabinets, within at least one traffic-control network. In addition, this invention relates to providing a system for efficient testing of NEMA-standard TS-1, TS-2, 170, and 2070 detector cards.

Current traffic control systems frequently utilize local electronic detectors that output a signal in the presence of a vehicle or preemption. These systems are often used to adjust signal sequences and timing, collect traffic data, activate special control devices, measure speeds, etc. The National Electrical Manufacturers Association (NEMA) has established standards for electronic vehicular traffic controller assemblies. These standards have been adopted by many traffic control equipment manufacturers along with a majority of governing agencies having jurisdiction over the traffic control systems based on such products.

Controllers/detectors based on the NEMA traffic control system standards provide a basic set of features and standard connectors. The detectors are generally described by the following attributes:

a) They are rack or shelf mounted;

b) They may comprise a pluggable, interchangeable bus interface unit to convert high-speed serial data to a format required by individual detectors or contact closures;

c) They may provide communications with controller unit, as described above;

d) They provide per-channel diagnostic data (open loop, shorted loop, excessive inductance change, watchdog failure, etc.);

e) They provide detector reset capability; and f) They operate from either 12-volt direct current (DC) or 24-volt DC power supply.

The standardization of NEMA-compliant traffic control cabinets has produced an unexpected problem for jurisdictions maintaining a plurality of older fixed-size traffic-control cabinets. Many of the existing NEMA-compliant traffic control cabinets were supplied from the factory pre-equipped to support a fixed number of rack or shelf mounted traffic-signal components. Many older existing traffic-control cabinets are now at full hardware capacity, incapable of receiving additional hardware without significant and costly rework or replacement. This often forces the overseeing jurisdiction to choose between omitting new, possibly mandated, technology upgrades, or committing to the costly reworking or replacement of the older "aging" cabinets. A need thus exists for systems and methods for extending the service life of such "aging" fixed-size traffic-control cabinets by facilitating the adding of additional required function within the cabinets, without major rework or replacement of the cabinets or internal components.

Like any electronic system, NEMA controller/detector apparatus require periodic maintenance and testing. Testing is often done in the field by accessing the devices typically located within the local traffic-control cabinet. Field testing is often hindered by adverse environmental conditions, which may include adverse weather conditions, extreme hot/cold temperatures, traffic, noxious fumes, excessive noise levels, etc. Removing and transporting the devices to a remote testing site greatly increases the overall cost of service. Clearly a need exists for more efficient means for providing such field maintenance and testing. A system allowing both hardware expansion within a traffic cabinet and a means for convenient in-the-field testing would be of great benefit to the traffic-control field.

OBJECTS AND FEATURES OF THE INVENTION

A primary object and feature of the present invention is to provide a system overcoming the above-mentioned problems. It is a further object and feature of the present invention to provide such a system allowing a traffic-control administering entity to extend the service life of aging fixed-size traffic-control cabinets. It is a further object and feature of the present invention to provide such a system comprising a set of modular components configured to operably enable at least one required additional function within the aging fixed-size traffic-control cabinets by electrically coupling at least one new electronic device to at least one existing electrical circuit of the cabinet, wherein the service life of the aging fixed-size traffic-control cabinet is then extended an appreciable time without removal or replacement of existing components. It is another object and feature of the present invention to provide such a portable system that can be used for detection in a full size cabinet where extra detectors are needed. It is a further object and feature of the present invention to provide such a portable system that can be used for detection in places where space is limited. It is another object and feature of the present invention to provide such a portable system that can be used in conjunction with data analysis detection.

It is a further object and feature of the present invention to provide such a system to assist a technician in a troubleshooting situation. It is another object and feature of the present invention to provide such a portable system that can be used to power up cards that need software configuration or upgrading; such power preferably provided by native vehicle direct current (DC) voltages or by low-voltage wall-transformer. It is a further object and feature of the present invention to provide such a portable system capable of assisting technician training and testing. A further primary object and feature of the present invention is to provide such a system that is efficient, inexpensive, and functional. Other objects and features of this invention will become apparent with reference to the following descriptions.

SUMMARY OF THE INVENTION

In accordance with a preferred embodiment hereof, this invention provides a method of extending the service life of a plurality of aging fixed-size traffic-control cabinets, within at least one traffic-control network, comprising the steps of: identifying at least one required additional function to extend the service life of at least one aging fixed-size traffic-control cabinet of such plurality of aging fixed-size traffic-control cabinets; identifying at least one new electronic circuit enabling the at least one required additional function when integrated within the at least one aging fixed-size traffic-control cabinet; designing at least one modular unit capable of adapting the at least one new electronic circuit to interoperate with the at least one aging fixed-size traffic-control cabinet, such at least one modular unit comprising at least one circuit support structured and arranged to mechanically support the at least one new electronic circuit, at least one signal-input coupler structured and arranged to assist electrical coupling of the at least one new electronic circuit to at least one signal input from at least one traffic-control device, at least one signal-output coupler structured and arranged to assist electrical coupling of at least one signal output of the at least one new electronic circuit to at least one existing electrical circuit of the at least one aging fixed-size traffic-control cabinet, at least one direct support-to-support interlocker structured and arranged to directly interlock such at least one circuit support to at least one other at least one circuit support of at least one other modular unit, and at least one mount structured and arranged to assist mounting of such at least one circuit support within the at least one aging fixed-size traffic-control cabinet; mounting such at least one modular unit within the at least one aging fixed-size traffic-control cabinet substantially without removal or replacement of existing components of the at least one aging fixed-size traffic-control cabinet; and operably enabling such at least one required additional function within the at least one aging fixed-size traffic-control cabinet by electrically coupling the at least one new electronic circuit to the at least one existing electrical circuit of the at least one aging fixed-size traffic-control cabinet using such at least one signal-input coupler and such at least one signal-output coupler of such least one modular unit; wherein the service life of the at least one aging fixed-size traffic-control cabinet is extended an appreciable time without removal or replacement of existing components.

Moreover, it provides such a method further comprising the steps of: designing such at least one circuit support to removably support at least one rack-mountable electronic card unit comprising the at least one new electronic circuit; providing at least one card coupler structured and arranged to electrically couple to at least one electronic-signal connector of the rack-mountable electronic card when removably supported within such at least one circuit support; formatting such at least one signal output coupler to comprise at least one signal-transmission format compatible with the establishing of at least one operable signal link between the at least one the rack-mountable electronic card unit and at least one existing electronic controller of the at least one existing electrical circuit; and providing at least one signal-transmission circuit structured and arranged to form at least one signal-transmission link between such at least one card coupler, such at least one signal-input coupler, and such at least one signal-output coupler. Additionally, it provides such a method further comprising the step of designing at least one modular unit capable of adapting at least one NEMA-type traffic signal detector card to interoperate with the at least one aging fixed-size traffic-control cabinet. Also, it provides such a method further comprising the step of designing at least one modular unit capable of adapting at least one NEMA-type traffic signal preemption card to interoperate with the at least one aging fixed-size traffic-control cabinet.

In addition, it provides such a method further comprising the steps of: providing at least one supportive housing structured and arranged to supportively house such at least one circuit support, such at least one card coupler, such at least one signal-transmission circuit, such at least one signal-input coupler, such at least one signal-output coupler, and such at least one mount; joining such at least one direct support-to-support interlocker to such at least one supportive housing in at least one interlockable position allowing such direct support-to-support interlocking. And, it provides such a method further comprising the steps of: arranging such at least one signal-output coupler to comprise at least one electronic-data-transmission format compatible with the establishing of at least one electronic-data-communication link between the at least one the rack-mountable electronic card unit and at least one existing computer-data bus of the at least one existing electrical circuit; and arranging such at least one signal-transmission circuit to form at least one compatible data-communication link between such at least one card coupler and such at least one signal-output coupler.

Further, it provides such a method further comprising the steps of: providing at least one external-power coupler structured and arranged to couple such at least one new electrical circuit to at least one external source of electrical power; providing at least one electrical-power formatter structured and arranged to format the at least one external source of electrical power, received at such at least one external power coupler, to provide formatted electrical power substantially matching at least one electrical power standard associated with the at least one new electronic circuit; and providing at least one formatted-power supply circuit structured and arranged to supply the formatted electrical power to the at least one new electrical circuit. Even further, it provides such a method wherein the step of identifying at least one required additional function to extend the service life of at least one aging fixed-size traffic-control cabinet of such plurality of aging fixed-size traffic-control cabinets further comprises the steps of: receiving from at least one municipality, governing the operation of the at least one traffic-control network, at least one specification for the at least one required additional function to be added; and receiving from the at least one municipality, identification of the aging fixed-size traffic-control cabinet to be retrofitted to comprise the at least one required additional function. Moreover, it provides such a method further comprising the step of designing at least one modular unit to provide data communication between the aging fixed-size traffic-control cabinet and at least one network protocol data stream external of the aging fixed-size traffic-control cabinet.

Additionally, it provides such a method further comprising the step of designing at least one modular unit structured and arranged to provide electrical power to at least one electrical device of the aging fixed-size traffic-control cabinet. Also, it provides such a method further comprising the step of designing at least one modular unit structured and arranged to provide a visual status of the functioning of the at least one rack-mountable electronic card unit when coupled to such at least one card coupler.

In accordance with another preferred embodiment hereof, this invention provides a system related to the functional integration of traffic-signal components, at least comprising at least one rack-mountable electronic card unit, within at least one existing computer-data bus of at least one existing traffic-control cabinet, such at least one existing computer-data bus configured to transfer data between such traffic signal components and at least one existing traffic-control computer, such system comprising: at least one modular adapter structured and arranged to the functionally integrate at least one required additional function within the at least one existing traffic-control cabinet; wherein such at least one modular adapter comprises at least one card support structured and arranged to removably support such at least one rack-mountable electronic card unit, at least one card coupler structured and arranged to electrically couple to at least one card-interface connector of such at least one rack-mountable electronic card unit, at least one signal-input coupler structured and arranged to assist electrical coupling of such at least one rack-mountable electronic card unit to at least one signal input from at least one traffic-control device; at least one signal-output coupler structured and arranged to assist electrical coupling of at least one signal output of such at least one rack-mountable electronic card unit to the at least one existing computer data bus, at least one signal-transmission circuit structured and arranged to transmit electronic signals between such at least one card coupler and such at least one signal-input coupler and such at least one signal-output coupler, at least one direct interlocker structured and arranged to directly interlock such at least one card support to at least one other card support of such system, and at least one mount structured and arranged to mount such at least one card support within the at least one existing traffic-control cabinet; wherein such direct interlocking of such at least one card support to at least one other card support forms at least one interlocked card-supporting set; and wherein such at least one direct interlocker is further structured and arranged to allow disjoining of at least one such at least one card support from such at least one interlocked card-supporting set without disjoining all other such at least one card supports from such at least one interlocked card-supporting set.

In addition, it provides such a system wherein such at least one signal-transmission circuit further comprises: at least one external-power coupler structured and arranged to couple such at least one signal-transmission circuit to at least one external source of electrical power; at least one electrical-power formatter structured and arranged to format the at least one external source of electrical power, received at such at least one external power coupler, to provide formatted electrical power substantially matching at least one electrical power standard associated with such at least one rack-mountable electronic card unit; and at least one formatted-power electrical pathway structured and arranged to supply the formatted electrical power to the at least one rack-mountable electronic card unit. And, it provides such a system wherein such at least one electrical-power formatter is structured and arranged to format such at least one external source of electrical power to providing an output voltage having a value selectable between about +12 volts direct current and about +24 volts direct current.

Further, it provides such a system further comprising at least one modular adapter capable of adapting at least one NEMA-type traffic signal detector card to interoperate with the at least one existing traffic-control cabinet. Even further, it provides such a system further comprising at least one modular unit capable of adapting at least one NEMA-type traffic signal preemption card to interoperate with the at least one existing traffic-control cabinet. Moreover, it provides such a system further comprising: at least one communication module structured and arranged to provide data communication between the at least one existing computer data bus and at least one network data device external of the at least one traffic-control cabinet; wherein such at least one communication module comprises at least one direct interlocker structured and arranged to directly interlock such at least one communication module with at least one other direct interlocking modular component of such system. Additionally, it provides such a system further comprising: at least one power module structured and arranged to provide regulated electrical power to at least one of the traffic-signal components within the at least one existing traffic-control cabinet; wherein such at least one power module comprises at least one direct interlocker structured and arranged to directly interlock such at least one communication module with at least one other direct interlocking modular component of such system.

Also, it provides such a system wherein such at least one card retainer further comprises: at least one housing structured and arranged to supportively house the at least one rack-mountable electronic card unit; wherein such at least one housing comprises at least one interior compartment structured and arranged to contain such at least one card coupler and such at least one electrical circuit, at least one arrangement of outer walls structured and arranged to substantially enclose such at least one interior compartment, and extending substantially through at least one outer wall of such at least one arrangement of outer walls, at least one card passageway structured and arranged to allow passage of the rack-mountable electronic card unit therethrough; and wherein such at least one arrangement of outer walls comprise such at least one signal-input coupler, such at least one signal-output coupler, such at least one direct support-to-support interlocker, such at least one external-power coupler, and such at least one mount. In addition, it provides such a system further comprising: at least one visual status indicator structured and arranged to visually indicate functioning status of the at least one rack-mountable electronic card unit when coupled to such at least one card coupler; wherein such at least one visual status indicator is mounted in at least one user-visible location within such at least one arrangement of outer walls. And, it provides such a system further comprising: at least one alternating current to direct current electrical transformer structured and arranged to transform line voltage alternating current to reduced voltage direct current; wherein such at least one alternating current to direct current electrical transformer comprises at least one male plug portion structured and arranged to be pluggable into a conventional line-voltage alternating current receptacle, and at least one corded coupler structured and arranged to couple the reduced voltage direct current to such at least one external-power coupler.

Further, it provides such a system further comprising: at least one vehicular-accessory power adapter structured and arranged to receive electrical current from at least one vehicle; wherein such at least one vehicular-accessory power adapter comprises at least one male plug portion structured and arranged to be pluggable into at least one vehicular-accessory power receptacle, and at least one corded coupler structured and arranged to couple the electrical current to such at least one external-power coupler. Even further, it provides such a system further comprising: at least one battery power source structured and arranged to provide electrical current from at least one current-producing electrical battery; wherein such at least one battery power source comprises at least one battery engager structured and arranged to electrically engage the at least one current-producing electrical battery, and electrically coupled to such at least one battery engager, at least one corded coupler structured and arranged to couple the electrical current to such at least one external-power coupler.

In accordance with another preferred embodiment hereof, this invention provides a kit system related to onsite testing of individual traffic-signal components, at least comprising rack-mountable electronic card units, of at least one existing traffic-control cabinet, such kit system comprising: at least one testing unit structured and arranged to test at least one operation of at least one such rack-mountable electronic card unit; wherein such at least one testing unit comprises at least one card support structured and arranged to removably support such at least one rack-mountable electronic card unit, at least one card coupler structured and arranged to electrically couple to at least one computer-data-bus connector of such at least one rack-mountable electronic card unit, at least one data-interface coupler structured and arranged to be connectably interfaced with the at least one data communication port of at least one external testing computer, at least one electrical circuit structured and arranged to transmit electronic signals between such at least one card coupler and such at least one data-interface coupler, at least one visual status indicator structured and arranged to visually indicate functioning status of the at least one rack-mountable electronic card unit when coupled to such at least one card coupler, at least one external-power coupler structured and arranged to couple the at least one rack-mountable electronic card unit to at least one external source of electrical power, at least one external power source structured and arranged to supply operable electrical power to such external-power coupler; and at least one set of operating instructions to assist a user in testing the at least one rack-mountable electronic card unit using such at least one testing unit.

Even further, it provides such a kit system wherein such at least one external power source comprises: at least one alternating current to direct current electrical transformer structured and arranged to transform line voltage alternating current to reduced voltage direct current; wherein such at least one alternating current to direct current electrical transformer comprises at least one male plug portion structured and arranged to be pluggable into a conventional line-voltage alternating current receptacle, and at least one corded coupler structured and arranged to couple the reduced voltage direct current to such at least one external-power coupler. Even further, it provides such a kit system wherein such at least one external power source comprises: at least one vehicular-accessory power adapter structured and arranged to receive electrical current from at least one vehicle; wherein such at least one vehicular-accessory power adapter comprises at least one male plug portion structured and arranged to be pluggable into at least one vehicular-accessory power receptacle, and at least one corded coupler structured and arranged to couple the electrical current to such at least one external-power coupler.

Even further, it provides such a kit system wherein such at least one external power source comprises: at least one battery power source structured and arranged to provide electrical current from at least one current-producing electrical battery; wherein such at least one battery power source comprises at least one battery engager structured and arranged to electrically engage the at least one current-producing electrical battery, and electrically coupled to such at least one battery engager, at least one corded coupler structured and arranged to couple the electrical current to such at least one external-power coupler. In accordance with other preferred embodiments hereof, this invention provides each and every novel feature, element, combination, step and/or method disclosed or suggested by this patent application.

DETAILED DESCRIPTION OF THE BEST MODES AND PREFERRED EMBODIMENTS OF THE INVENTION

Figure 1:
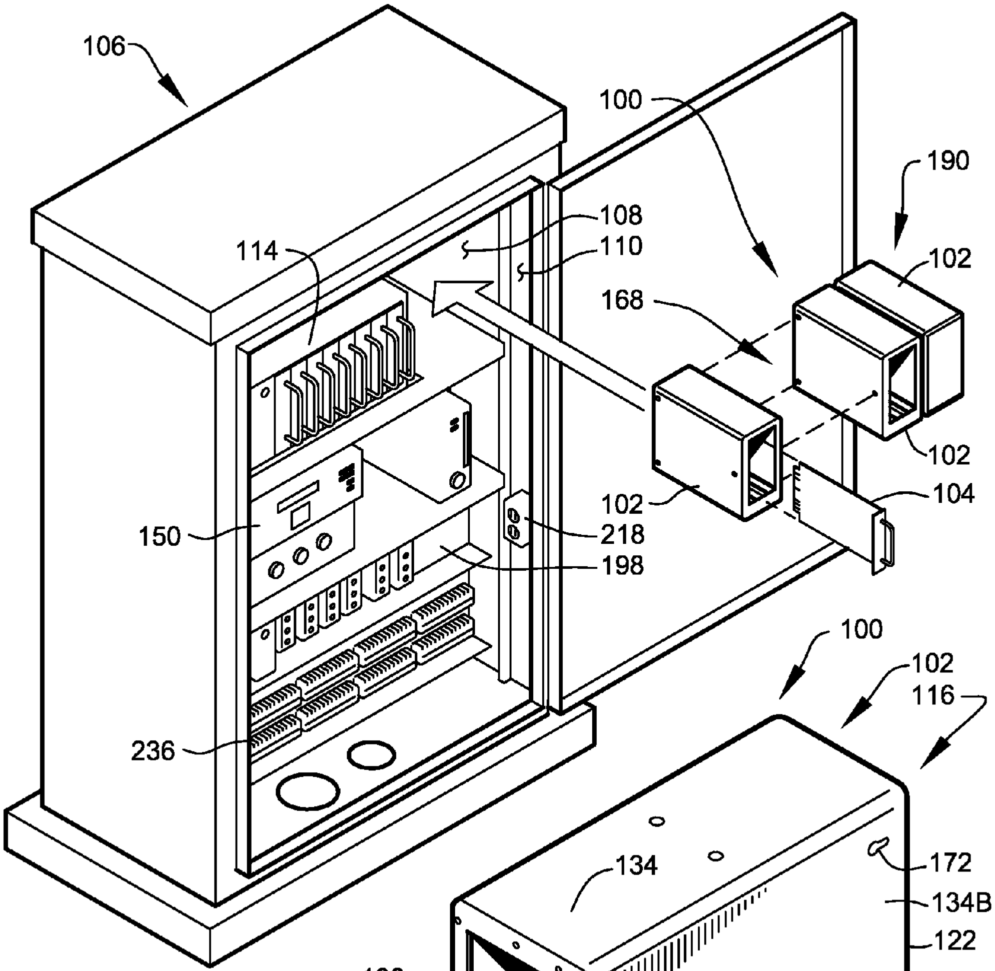
FIG. 1 shows a perspective view, illustrating a set of interlockable modular adapters, functioning to integrate one or more coordinated-actuated traffic signal components within an existing traffic-control cabinet, according to a preferred embodiment of the present invention.

FIG. 1 shows a perspective view, illustrating a set of compact modular adapters 102, preferably functioning to integrate one or more coordinated-actuated traffic-signal components 104 within an existing traffic-control cabinet 106, according to a preferred embodiment of the present invention. The systems disclosed herein are preferably designed to support additional or modified detection, preemption, and other similar expanded functions within traffic controller assemblies conforming to the standards and requirements of the National Electrical Manufacturers Association, hereinafter called NEMA. Upon reading this specification, those with ordinary skill in the art will now appreciate that, under appropriate circumstances, considering such issues as country of operation, local governing regulations, etc., other arrangements such as, for example, providing alternate embodiments supporting additional or modified detection within traffic controller assemblies designed to the standards of other countries, newly adopted domestic standards, etc., may suffice.

Preferred embodiments of traffic-control expansion and testing system 100, including the depicted modular adapters 102, are preferably designed to provide an efficient low-cost means for extending the service life of "aging" fixed-size traffic-control cabinets, especially those which have reached full hardware capacity. Such fully-populated fixed-size traffic-control cabinets are prevalent in many traffic-control networks both in the North America and other national jurisdictions around the world.

The preferred development and use of small compact modular adapters 102, as embodied within the present system, preferably allows additional functions to be added within a fully populated traffic-control cabinet 106, preferably by utilizing the small available spaces 108 within the cabinet interior 110. These small spaces comprise physical dimensions that are insufficient to accommodate conventional hardware installations, but readily accommodate the placement of compact modular adapters 102, as shown. Mounting of the compact modular adapters 102 is typically accomplished without removal or replacement of existing components within cabinet interior 110.

Each compact modular adapter 102 is preferably designed to provide necessary hardware and/or software systems supporting the integration of new electronic circuits/hardware enabling such additional required function(s), preferably in the form of a new traffic-signal component 104 within traffic-control cabinet 106, as shown.

The preferred structures and arrangements of the embodiments described herein preferably support a wide variety of traffic-signal components 104. These preferably include the integration of external network communication units, power-supply units, and additional rack-mountable electronic cards 112, as further described herein.

Figure 2:
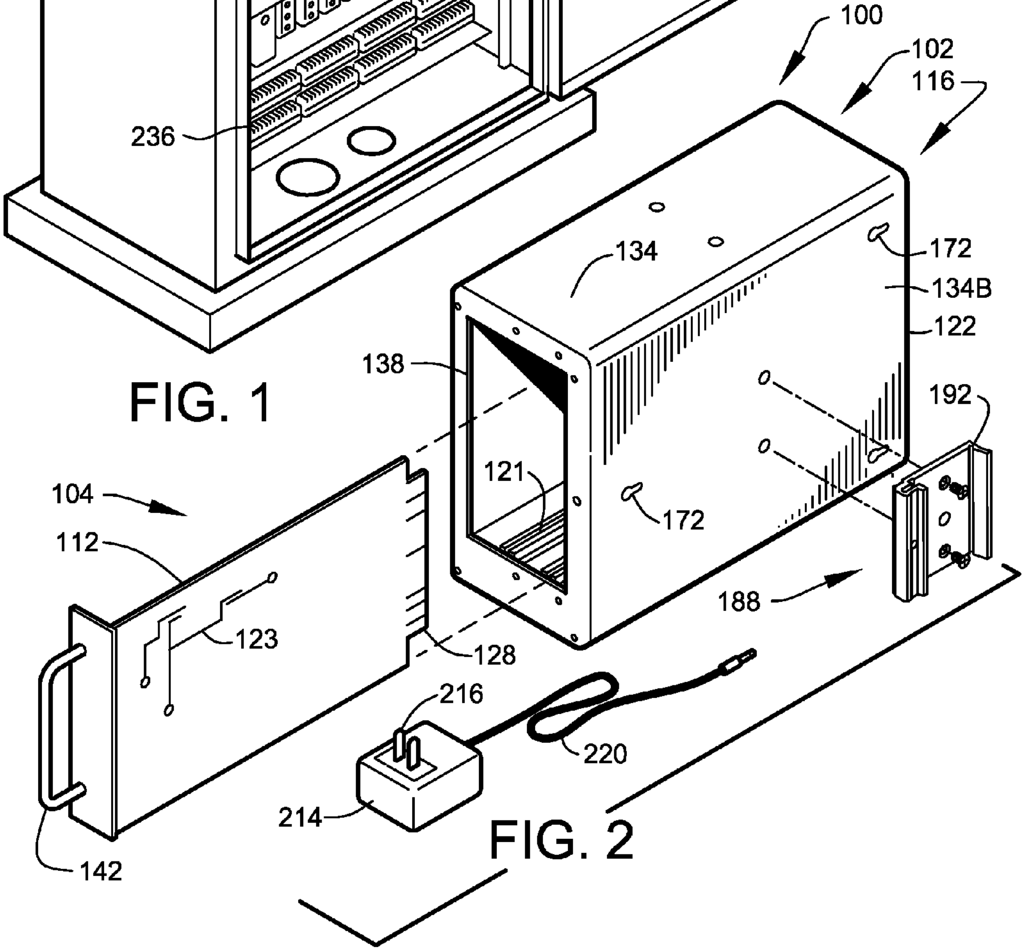
FIG. 2 shows a perspective view illustrating a single modular adapter designed to integrate operably an additional rack-mountable electronic card unit within the existing traffic-control cabinet, according to a preferred embodiment of the present invention.
Figure 3A:
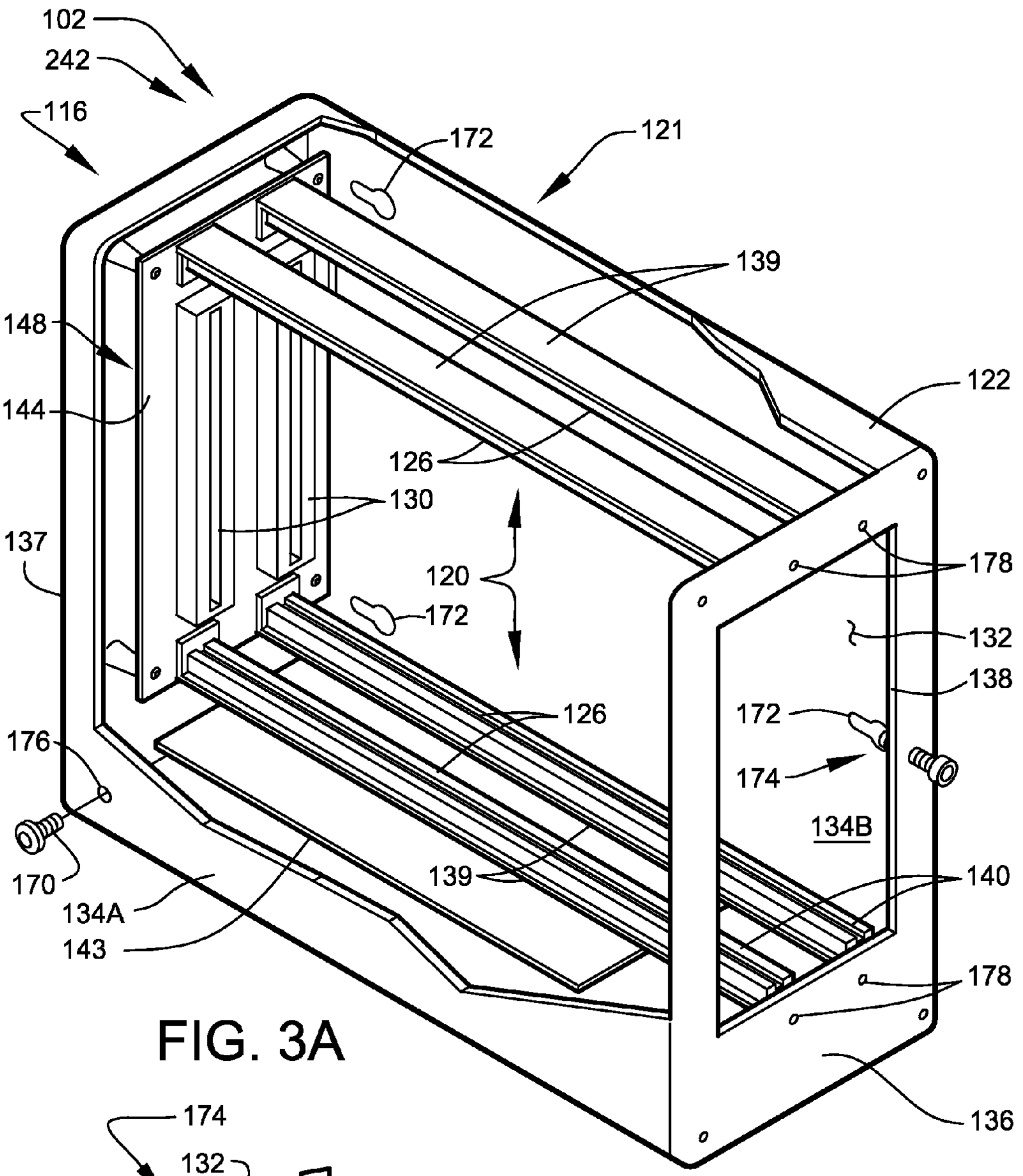
FIG. 3A shows a perspective view, in partial cutaway, illustrating preferred arrangements of the modular adapter of FIG. 1.

FIG. 2 shows a perspective view illustrating a first preferred embodiment of the present invention in the form of a single compact modular adapter 102, preferably designed to integrate at least one additional rack-mountable electronic card 112 within existing traffic-control cabinet 106. FIG. 3A shows a perspective view, in partial cutaway, illustrating preferred internal and external arrangements of the embodiment of FIG. 1.

In general, each compact modular adapter 102 preferably comprises at least one circuit-supporting structure 121 designed to support one or more new electronic circuits 123 within the cabinet interior. The compact modular adapter 102 of FIG. 2, identified herein the as card rack module 116, is preferably structured and arranged to provide the principal functional components required to integrate one or two rack-mountable electronic cards 112 within traffic-control cabinet 106. In card rack module 116, circuit-supporting structure 121 preferably takes the form of card support assembly 120 provided configured to removably support rack-mountable electronic card 112 within traffic-control cabinet 106.

The supportive components of card support assembly 120 preferably comprises a set of upper and lower guides 126 (See FIG. 3A), preferably used to support the upper and lower edges of rack-mountable electronic card 112 and assist the guiding of a computer-data-bus edge connector 128 of the card to a seated (electrically coupled) position within edge-connector socket(s) 130. The upper and lower guides 126 each preferably comprise a U-shaped plastic rail held in alignment by a rigid support member 139, as shown.

The construction of card support assembly 120 is further defined by a compact outer housing 122, preferably comprising an interior compartment 132 configured to supportively house the upper and lower guides 126, edge-connector socket (s) 130, and rack-mountable electronic card 112. It should be noted that the preferred physical size and major external arrangements of outer housing 122 are substantially consistent across all embodiments of system. This preference facilitates the preferred grouping of individual modules of the system into an organized modular set of functioning components, as will be further described below.

The preferred construction of outer housing 122 comprises an arrangement of spaced-apart outer walls 134 substantially enclosing interior compartment 132, as shown. Outer walls 134 are preferably oriented in a generally orthogonal arrangement as to form a substantially rectangular solid, as shown. A rectangular opening, identified herein as card passageway 138, preferably extends through the front outer wall 136 to allow at least partial passage of at least one rack-mountable electronic card 112, through outer housing 122, to engage at least one of the two edge-connector socket(s) 130. In preferred embodiments of outer housing 122, front outer wall 136 and/or rear outer wall 137 are removable from the main housing assembly to facilitate access to the components contained therein.

In combination, the upper and lower guides 126 and edge-connector socket(s) 130 preferably form a set of card slots 140, most preferably two card slots 140, each one preferably configured to receive a NEMA-compliant two-channel rack-mountable electronic card 112 having a maximum end width of about 28.96 mm (1.14 inches), a maximum height of about 114.3 mm (4.5 inches), and a maximum length of about 177.8 mm (7 inches) excluding the pull handle 142. Furthermore, the horizontal spacing between the two card slots 140 is preferably set a distance A (see FIG. 7) of about 30 millimeters (1.18 inches). This dimensional preference allows a single card slot 140 to support a wider four-channel rack-mountable electronic card 112, which by NEMA standards comprises a maximum width of about 59.44 mm (2.34 inches). Upon reading this specification, those with ordinary skill in the art will now appreciate that, under appropriate circumstances, considering such issues as advances in technology, changes in governing standards, etc., other slot arrangements such as, for example, adopting alternate physical configurations to accommodate alternate rack-mountable cards, alternate numbers of rack-mountable cards, etc., may suffice.

Each edge-connector socket 130 is preferably mounted on backplane 144, preferably an active backplane (containing operating circuitry of onboard electrical circuit 148), preferably located adjacent the rear portion of interior compartment 132, as shown. Backplane 144 preferably comprises a printed circuit board (PCB) supporting data and power interface circuitry of card rack module 116. Alternately preferably, the data and power interface circuitry of card rack module 116 may be divided between backplane 144 and additional PCBs 143 located within interior compartment 132, as shown. Backplane 144 is also preferably used structurally to support the back end of rigid support member 139, as best shown in FIG. 3.

The primary card types supported by preferred embodiments of card rack module 116 are vehicle detector cards and preemption detector cards. Both card types typically comprise card-specific pin/connector formats, but both card types will engage edge-connector socket 130, which preferably comprise a 44 position 22-pin double-sided format as specified by current NEMA standards. Thus, the same card rack module 116 is preferably capable of supporting both types of cards, with the only significant modification needed comprising a change to onboard electrical circuit 148 within backplane 144, as further described below (at least embodying herein at least one modular adapter capable of adapting at least one NEMA-type traffic signal detector card to interoperate with the at least one existing traffic-control cabinet; and at least embodying herein comprising at least one modular unit capable of adapting at least one NEMA-type traffic signal preemption card to interoperate with the at least one existing traffic-control cabinet).

Card rack module 116, is preferably structured and arranged to accept NEMA-style 170, 332, TS-1, or TS-2 detector cards. Preferred circuit arrangements for a card rack module 116, supporting the operation of vehicle detector cards, are schematically diagrammed in FIG. 13 (with preferred circuit arrangements for an alternate card rack module 116 supporting preemption detector cards shown in FIG. 14).

Figure 8:
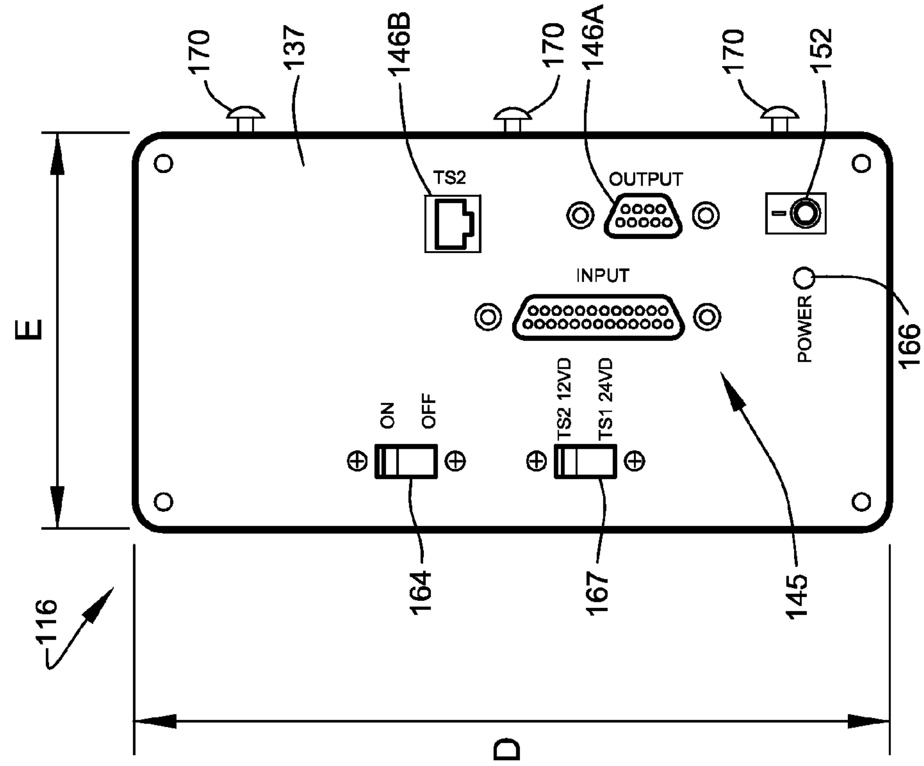
FIG. 8 shows a rear elevational view of the modular adapter of FIG. 1.

Card rack module 116 preferably comprises a set of electrical input and output ports identified herein as signal-input coupler 145 and signal-output coupler 146, as shown in FIG. 8. Signal-input coupler 145 provides a connectable interface point to receive electrical signals from the detector field connections at detection panel 236 (or other remote-detection technology). Signal-output coupler 146 preferably provides a direct or indirect connectable interface point between card rack module 116 and existing electronic controller 150 of traffic-control cabinet 106. Each of the aforementioned interface couplers are preferably located in a position conveniently accessible to external cabling, most preferably on rear outer wall 137, as best illustrated in the elevational depiction of FIG. 8.

Backplane 144 preferably comprises at least one onboard electrical circuit 148 structured and arranged to transmit electronic signals between edge-connector socket(s) 130 (at least embodying herein at least one card coupler) and both signal-input coupler 145 and signal-output coupler 146. Each circuit component, preferably including edge-connector socket(s) 130, signal-input coupler 145, signal-output coupler 146, and the connecting onboard electrical circuit 148, is preferably formatted to conform to at least one signal-transmission format consistent with the establishment of direct or indirect operable signal links between the field hardware, rack-mountable electronic card 112, and existing electronic controller 150 of traffic-control cabinet 106 (see FIG. 4 and FIG. 5).

NEMA-compliant rack-mountable electronic cards 112 customarily operate using a 12 volt or 24-volt direct current (DC) electrical power source. In the preferred power circuiting arrangement of preferred embodiments of the system, card rack module 116 preferably comprises at least one external-power coupler 152 to electrically couple onboard electrical circuit 148 to at least one external source of electrical power. Onboard electrical circuit 148 of card rack module 116 is preferably configured to use the electrical power supplied at external-power coupler 152 to energize each rack-mountable electronic cards 112 coupled to edge-connector socket(s) 130 within card rack module 116.

Figure 13:
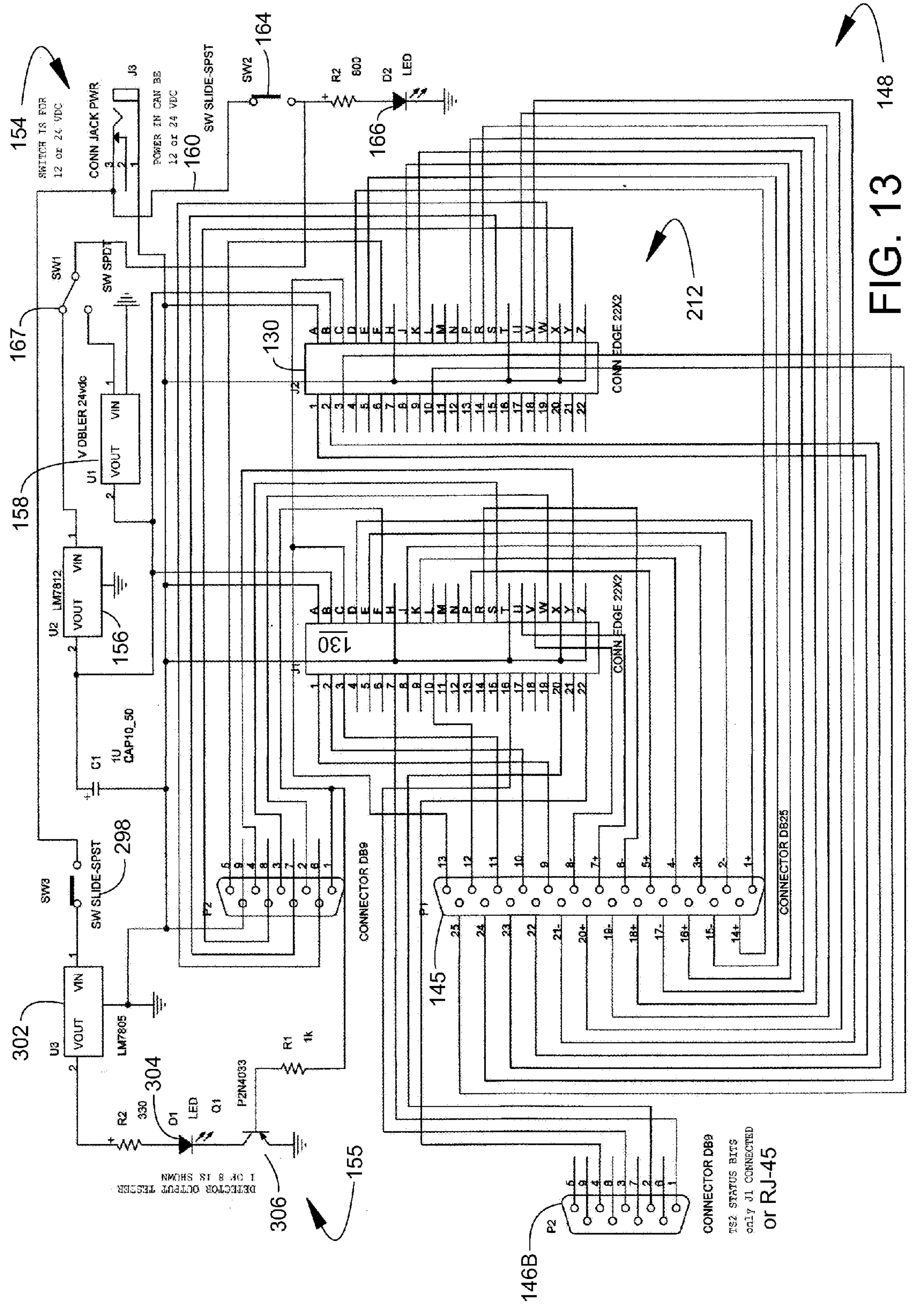
FIG. 13 is a schematic circuit diagram illustrating preferred circuit arrangements of the modular adapter of FIG. 1.

In specific reference to the electrical circuit diagram of FIG. 13, onboard electrical circuit 148 preferably comprises power-formatting sub circuit 154, preferably functioning to format the externally sourced electrical power to match the electrical load requirements of rack-mountable electronic card 112 (at least embodying herein at least one electrical-power formatter structured and arranged to format the at least one external source of electrical power, received at such at least one external power coupler, to provide formatted electrical power substantially matching at least one electrical power standard associated with the at least one rack-mountable electronic card). Power-formatting sub circuit 154 is preferably configured to allow card rack module 116 to use any external DC source having a voltage of either about 12 volts or about 24-volts (at least embodying herein wherein such at least one electrical-power formatter is structured and arranged to format such at least one external source of electrical power to providing an output voltage having a value selectable between about +12 volts direct current and about +24 volts direct current).

12 volt or 24-volt DC power preferably enters the circuit at external-power coupler 152 (J3), as shown. Positive lead 160 of external-power coupler 152 is preferably routed to a user-operable main-power switch 164 (SW2). An indicator light imaging diode (LED 166) is preferably arranged to illuminate when main-power switch 164 is closed and supplying power to power-formatting sub circuit 154 (it is noted that a resistor may be used, as required, to limit the incoming voltage to match the operating voltage of the preferred LED 166 selected), as shown. In an alternate preferred embodiment of the present invention, positive lead 160 is preferably split to supply testing sub circuit 155, preferably comprising an optional branch circuit supporting on-board testing of rack-mountable electronic card 112, as further described in FIG. 18.

From main-power switch 164 positive lead 160 is preferably routed to a user-operable voltage-selector switch 167 (SW1) preferably arranged to control passage of the incoming current between voltage-regulator component 156 and voltage-doubler component 158, as shown. Outputs from both voltage-regulator component 156 and voltage-doubler component 158 are routed to the appropriate positive current-supplying pins of the respective on-board electrical coupler (s) 212, as shown (at least embodying herein at least one formatted-power electrical pathway structured and arranged to supply the formatted electrical power to the at least one computer-data-bus connector of the at least one rack-mountable electronic card unit).

Voltage-regulator component 156 is preferably configured to supply a fixed 12-volt DC output on input of 12 volts DC or 24 volts DC at external-power coupler 152. Voltage-regulator component 156 preferably comprises a three-terminal positive regulator based on an LM7812 integrated circuit (IC), or similar devices preferably capable of handling up to about 2 amps maximum current and up to about 34-volts DC. A capacitor coupling the regulator output and negative bus is preferably used, as required, to improve stability and transient response.

Voltage-doubler component 158 is preferably configured to supply a fixed 24-volt DC output on input of 12 volts DC. Voltage-doubler component 158 is diagrammatically depicted as a three-lead component but may preferably comprise one or more electrical devices combined in an operable arrangement, as will now be appreciated by one of ordinary skill in the art.

Referring again to FIG. 1 and FIG. 2, each supportive outer housing 122 preferably comprises a housing-to-housing interlocker assembly 168 to assist the direct mechanical interlocking of outer housing 122 to one or more other outer housings 122 of the system (at least embodying herein at least one direct interlocker structured and arranged to directly interlock such at least one card support to at least one other card support of such system). This preferably enabled a set of modular adapters to be mechanically joined into a modular unit 190 to facilitate installation and offsite preassembly. Moreover, a such a set of card rack modules 116 can be combined to form a larger or smaller rack specific to a cabinet installation (at least embodying herein wherein such direct interlocking of such at least one card support to at least one other card support forms at least one interlocked card-supporting set). If required by a specific installation, set of interlocked card rack modules 116 can be configured to fully replace existing card rack 114.

Interlocker assembly 168 preferably comprises a projecting set of posts 170 configured to engage a complementary set of recessed sockets 172, as shown. In a preferred arrangement three posts 170 are preferably mounted to project from a first outer side wall 134A of outer housings 122, as shown. Three complementary recessed sockets 172 are preferably formed within opposing outer side wall 134B to receive posts 170, as shown. Each post 170 comprises an enlarged distal head portion, as shown. Each recessed socket 172 preferably comprises an opening of keyhole shape, as shown, which is cooperative with the enlarged distal head portion to retain each engaged post 170 in position. More specifically, after post 170 is inserted within recessed socket 172, post 170 is moved to a locked position whereby the enlarged distal head portion is situated behind a narrower portion of the keyhole opening to prevent removal.

The above described interlocking arrangements preferably allow the disjoining of one card rack module 116 from a modular unit 190 (such at least one interlocked card-supporting set) without disjoining all other card rack modules 116 or other interlocked modular adapters 102 from the modular unit 190. This preferred arrangement allows a single modular adapter 102 to be removed from the modular unit 190, for testing or replacement, with minimal disruption to the remaining members of the set (at least embodying herein wherein such at least one direct interlocker is further structured and arranged to allow disjoining of at least one such at least one card support from such at least one interlocked card-supporting set without disjoining all other such at least one card supports from such at least one interlocked card-supporting set).

Each post 170 preferably comprises a 10/32 threaded screw having a preferred length of about ¼". Each post 170 is located within a respective threaded socket 176, preferably located within outer side wall 134A, preferably at three peripheral locations corresponding to the opposing recessed sockets 172, as shown. The preferred use of threaded sockets 176 allows posts 170 to be removed from outer side wall 134A when interlocking of housings is not required. To facilitate the convenient storage of posts 170 when not in use, front outer wall 136 preferably comprises a second set of threaded sockets 178 in which posts 170 may be engaged between use.

Figure 3B:
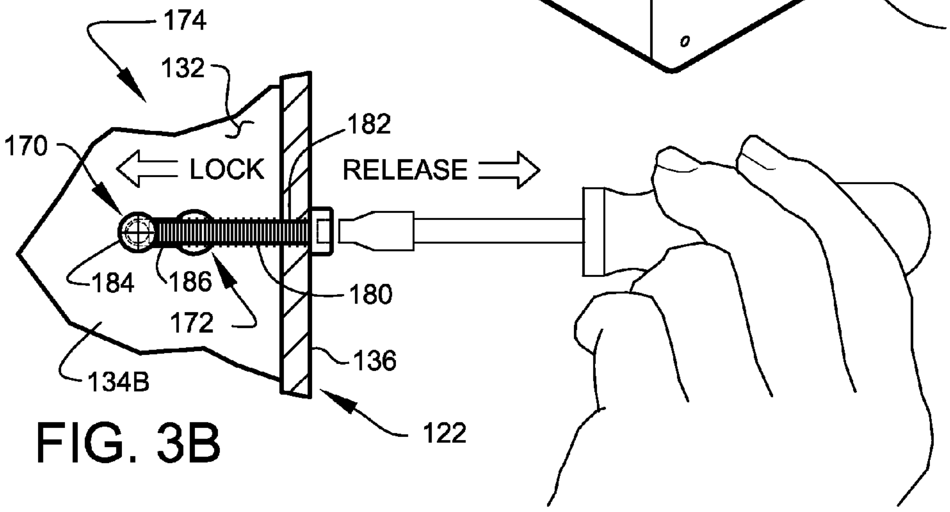
FIG. 3B shows a side sectional view, through an outer housing, illustrating a preferred mechanical lock used to lock two outer housings in an interlocked arrangement, according to a preferred embodiment of the present invention.

Each outer housings 122 further comprises a mechanical lock 174 to mechanically lock the forward lock post 170 within its respective recessed socket 172. In a preferred arrangement, as best illustrated in FIG. 3B, lock 174 comprises threaded member 180 engaged within threaded aperture 182 of front outer wall 136. Threaded member 180 preferably extends within interior compartment 132 generally toward and aligned with the forward recessed socket 172, as shown. To prevent separation of interlock housings, threaded member 180 is preferably adjusted to a position of contact with the enlarged distal head portion 184 of the post 170, which is preferably engaged within the narrower slot portion 186 of the forward recessed socket 172, as shown. This arrangement preferably prevents post 170 from moving out of the narrower slot portion 186 of the keyhole opening. This prevents relative movements between the housings preventing separation.

Each outer housings 122 further preferably comprises an accommodation for an optional mounting assembly 188 preferably arranged to assist the mounting of one or more modular adapters 102 within traffic-control cabinet 106. Mounting assembly 188 preferably comprises mounting bracket 192 for the mounting outer housings 122 on a DIN-type mounting rail 194 (see FIG. 4 and FIG. 5) and a set of mounting fasteners 196 for attaching mounting bracket 192 to outer housing 122. A DIN rail is a standardized 35 mm-wide metal rail with a "hat-shaped" cross section. Mounting bracket 192 preferably comprises a commercially available DIN-rail mounting bracket preferably similar to model STK-DIN mounting bracket as produced by CUI Inc. of Tulane, Oreg. Upon reading this specification, those with ordinary skill in the art will now appreciate that, under appropriate circumstances, considering such issues as cost, advances in mounting technology, user preference, etc., other mounting arrangements such as, for example, Unistrut®-type channel mounts, rack-mounting hardware, cabinet-specific mounts, magnetic mounts, etc., may suffice.

Figure 4:
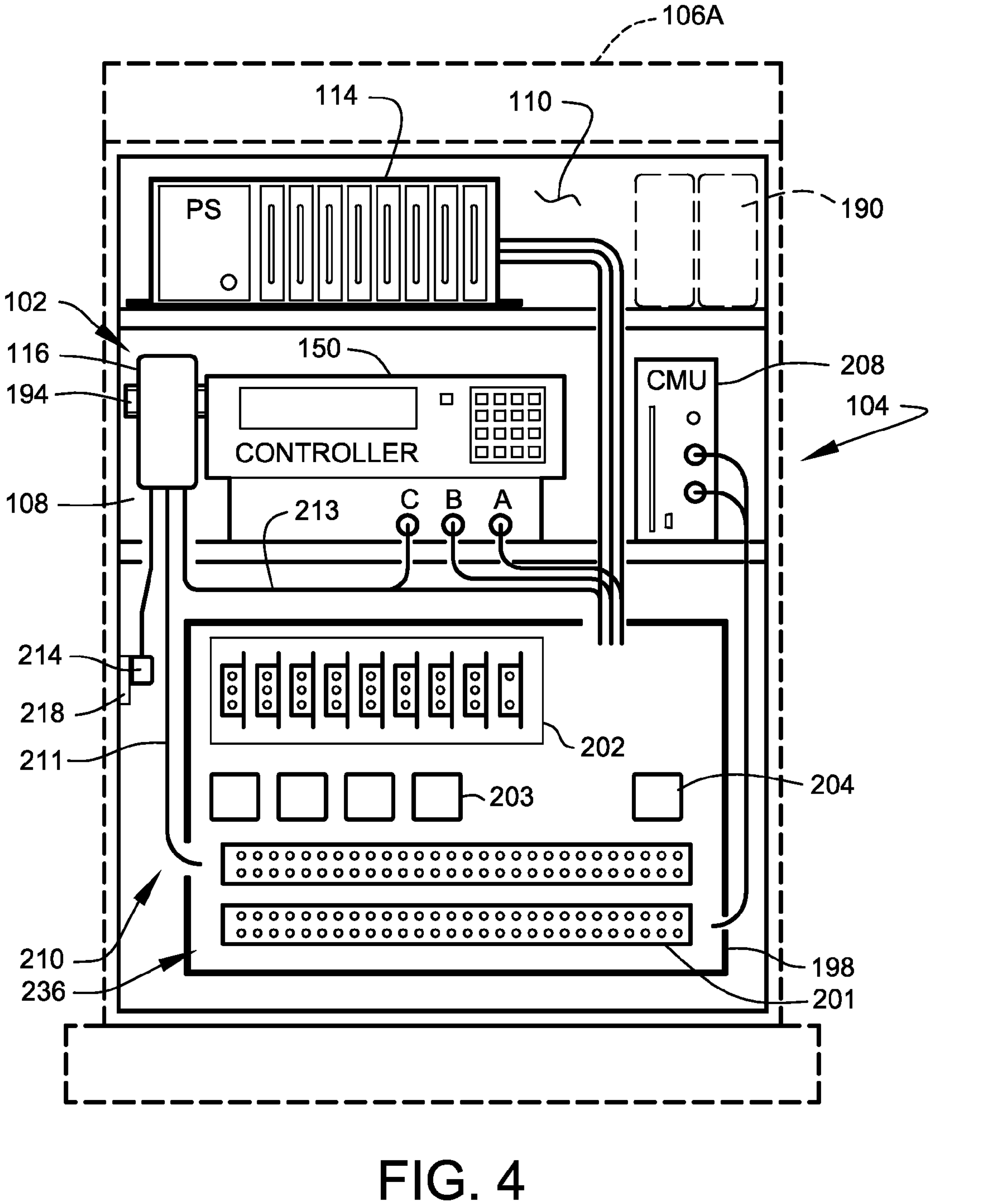
FIG. 4 shows a front elevational diagram illustrating an integration of a modular adapter within a generic NEMA-standard TS-1 traffic-control cabinet, according to a preferred embodiment of the present invention.

FIG. 4 shows a front elevational diagram illustrating an integration of modular adapters 102 within a NEMA-standard TS-1 traffic-control cabinet 106A, according to a preferred embodiment of the present invention. The NEMA TS-1 traffic signal controller standard was developed by NEMA in 1976, with the goal of providing interchangeability among equipment manufacturers. All of the equipment and software necessary to support the operation of existing electronic controller 150 was specified including all of the supporting wiring. The NEMA TS-1 traffic signal controller standards were eventually replaced by the more recent TS-2 standards; however, many thousands of aging NEMA-standard TS-1 traffic-control cabinets to remain in service today. Many of these cabinets are now at full hardware capacity and are incapable of receiving upgrades using conventional means. In addition, many of the existing TS-1 traffic control cabinets are incapable of accepting newer hardware due to the inherent incompatibility between the current technology and the cabinet's legacy hardware structures.

A typical NEMA TS-1 traffic signal control cabinet houses an existing back panel 198 containing existing field terminals 201 (connected to traffic hardware external of the cabinet), existing load switches 202, existing flasher relays 203, and existing flasher 204, as shown. Also found in the control cabinet is existing electronic controller 150, existing card rack 114, and existing conflict monitor unit 208, as shown. Existing electronic controller 150 comprises a computer-assisted device configured to control the operation of the traffic signals at the intersection. Existing conflict monitor unit 208 monitors the operation of the controller and traffic signals to prevent hazardous conditions, such as two conflicting green lights being activated at the same time. If existing conflict monitor unit 208 detects a fault, the conflict monitor activates flasher 204 to place the traffic signals in a flashing mode.

Existing card rack 114 typically comprises a factory unit, is of one size, and is permanently bolted in place. The depicted existing card rack 114 of NEMA-standard TS-1 traffic-control cabinet 106A holds existing rack-mountable electronic detector cards and is illustrated at maximum card capacity. If an additional rack-mountable electronic card 112 (or similar hardware component) is to be installed in such a cabinet, the entire existing card rack 114 must typically be removed and replaced with a larger-capacity unit (if such a larger-capacity device were to exist).

Card rack module 116 resolves the problem of insufficient rack capacity by utilizing small available spaces 108, within cabinet interior 110 to support additional rack-mountable cards, as shown. Card rack module 116 is shown mounted within cabinet interior 110 in a small region of open space to the left of existing electronic controller 150. Outer housing 122 of card rack module 116 is preferably mounted to the cabinet using mounting rail 194, as shown. An alternate preferred shelf mounted installation of a modular unit 190 (indicated by the dashed line depiction) is also shown. In the preferred installation, existing card rack 114 preferably remains in service without removal or modification.

NEMA-standard TS-1 traffic-control cabinets rely on point-to-point wire connections for all traffic-signal components 104 and related functions, as generally shown in FIG. 4. As noted above, card rack module 116 preferably comprises at least one set of housing-mounted electrical couplers, identified herein as signal-input coupler 145 and, for a TS-1 application, signal-output coupler 146A. Both couplers preferably allow a technician to electrically couple the new electronic circuit functions of the added rack-mountable electronic card 112 to the existing electrical circuiting of NEMA-standard TS-1 traffic-control cabinet 106A.

Preferably, signal-input coupler 145 is electrically coupled to the appropriate field connections of detection panel 236, as shown. Signal-output coupler 146A preferably comprises an electronic-data-transmission format compatible with the establishing of at least one bi-directional electronic-data-communication link between rack-mountable electronic card 112 and existing electronic controller 150.

Card rack module 116 is preferably coupled to NEMA-standard TS-1 traffic-control cabinet 106A using point-to-point cabling 210, as shown. Preferred point-to-point cabling 210 generally comprises the use of one signal-input cable 211 and one signal-output cable 213, as shown. Signal-input cable 211 preferably comprises a pig-tail patch harness having a proximal end fitted with a connector compatible with signal-input coupler 145 and a distal end suitable for forming individual hardwired connections within detection panel 236. Signal-output cable 213 preferably comprises a harness having a proximal connector compatible with signal-output coupler 146A and a distal end fitted with a round MIL-spec (MS) connector for connection to an A, B, C, or manufacturer-specific D data exchange port(s) of the TS-1 compliant electronic controller 150. Once connected, signal-output cable 213 is used to directly interface the 24-volt bi-directional logic signals generated by rack-mountable electronic card 112 to the TS-1 compliant electronic controller 150.

Power to energize card rack module 116 is preferably supplied by wall-mounted transformer 214, as shown. Transformer 214 preferably comprises an alternating current (AC) to DC transformer to convert a line-voltage alternating current input to a reduced voltage DC output. As illustrated in FIG. 2, transformer 214 preferably comprises male plug portion 216 pluggable into a conventional line-voltage AC receptacle 218, as shown in FIG. 4, and at least one corded coupler 220 structured and arranged to couple the reduced voltage DC output to external-power coupler 152 of card rack module 116.

Figure 5:
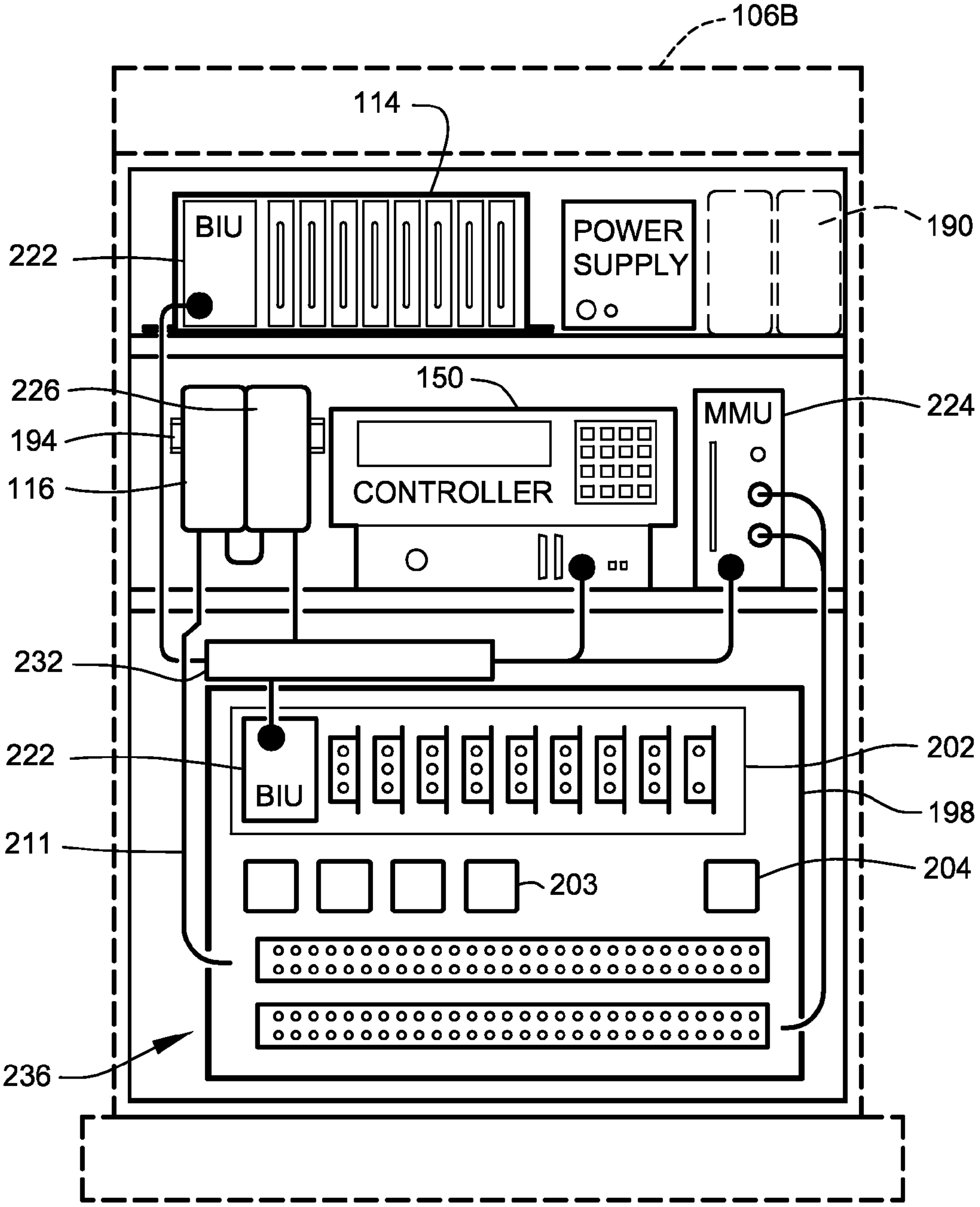
FIG. 5 shows a front elevational diagram illustrating an integration of a modular adapter within a generic NEMA-standard TS-2 traffic-control cabinet, according to a preferred embodiment of the present invention.
Figure 6:
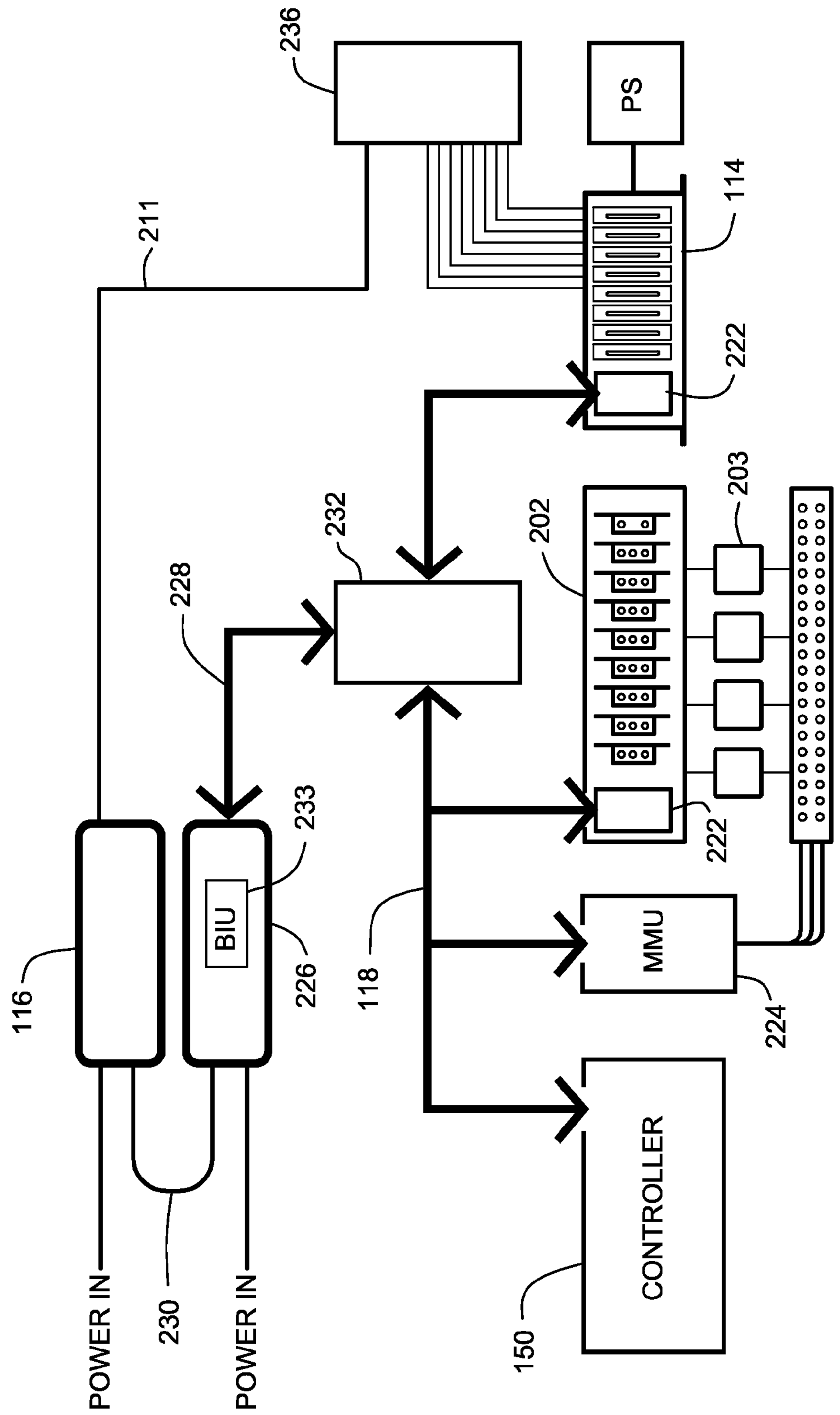
FIG. 6 shows a schematic diagram further illustrating the integration of the modular adapter within a NEMA-standard TS-2 traffic-control environment, according to the preferred embodiment of FIG. 5.

FIG. 5 shows a front elevational diagram illustrating an integration of modular adapters 102 within a NEMA-standard TS-2 traffic-control cabinet 106B, according to a preferred embodiment of the present invention. FIG. 6 shows a schematic diagram further illustrating the integration of modular adapters 102 within a NEMA-standard TS-2 traffic-control hardware environment, according to the preferred embodiment of FIG. 5.

The NEMA TS-2 cabinet is widely used across North America and evolved from the earlier TS-1 standard. The NEMA TS-2 cabinet currently comprises two main variants. The NEMA TS-2 Type 1 variant, as illustrated in FIG. 5 and FIG. 6, eliminates the point-to-point wiring of TS-1 in favor of a system routing all of the input and output data through SDLC computer data bus 118. The SDLC (synchronous data link) communication protocol was selected by NEMA as the standard protocol for data transmission between components of the cabinet. The SDLC computer data bus 118 operates at 153,600 bps and provides high-speed bi-directional communication between all cabinet components (a point-to-point wiring harness is retained to allow malfunctioned management unit 224 to monitor the outputs of existing load switches 202), as shown. In current NEMA TS-2 standards, the SDLC computer data bus 118 uses a four-wire RS-485 configuration comprising Rx-data, Rx-clock, Tx-data, and Tx-clock.

Existing load switches 202 and detectors (including existing rack-mountable electronic cards) are interfaced to SDLC computer data bus 118 using Bus Interface Units (BIUs 222), as shown. Each BIU 222 is responsible for converting the inputs and outputs monitored by existing electronic controller 150 into a form consistent with SDLC communication protocols.

In a preferred NEMA TS-2 type 1 installation, card rack module 116 is preferably coupled to the appropriate field-detection terminals within detection panel 236, preferably using signal-input cable 211. Card rack module 116 is preferably coupled to SDLC computer data bus 118 via a BIU-containing master module 226 (see also FIG. 15A and FIG. 15B), as shown. Master module 226 is preferably used to interface the 24-volt bi-directional logic signals generated by the new rack-mountable electronic card 112 with SDLC computer data bus 118 and the existing electronic controller 150.

Figure 15B:
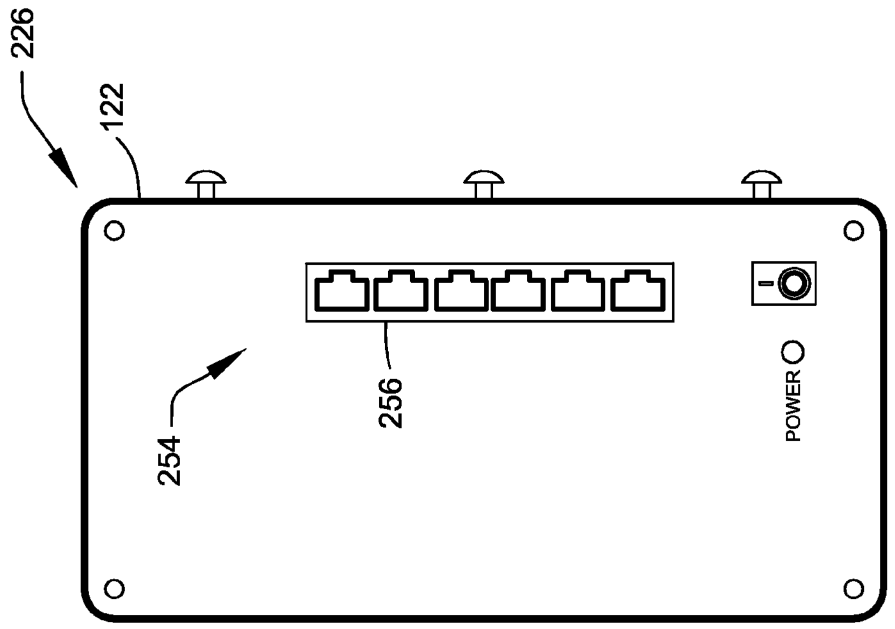
FIG. 15B shows a rear elevational view of a master unit containing a modular network-communications adapter, according to the preferred embodiment of FIG. 15A.
Figure 15A:
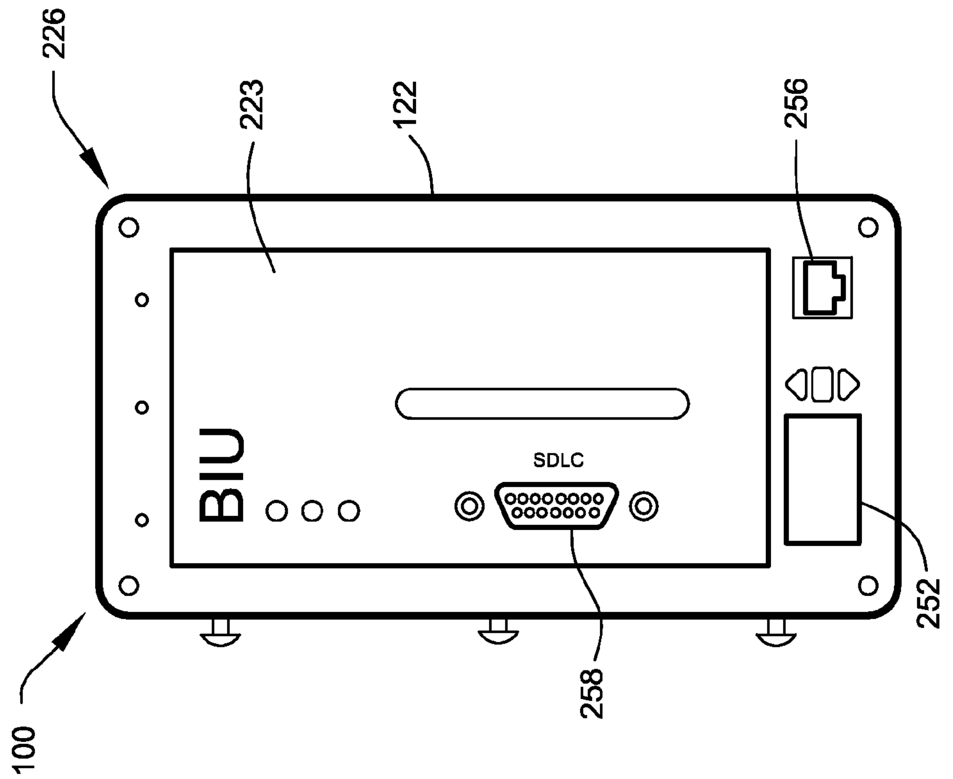
FIG. 15A shows a front elevational view of a master unit containing a modular network-communications adapter, according to another preferred embodiment of the present invention.

Master module 226 preferably comprises a system-compatible enclosure, preferably interlockable with outer housing 122, preferably containing electronic circuitry supporting BIU functionality in full compliance with applicable NEMA TS-2 standards (see also FIG. 15A and FIG. 15B). BIU functionality in master module 226 is preferably provided by an integrated computer-bus interface unit 233, preferably comprising a rack-mountable BIU card. BIU card assemblies adaptable to master module 226 are currently available through multiple commercial sources, as will now be appreciated by one of ordinary skill in the art.

Master module 226 preferably comprises at least one serial connector to provide a connection for SDLC output cable 230, preferably linking SDLC coupler 146B of card rack module 116 to at least one compatible port 255 of master module 226 (for receiving TS-2 status bit from card rack module 116). The interface connection 228 preferably comprises a cable harness linking at least one SDLC-compatible data output port of master module 226 to SDLC computer data bus 118 via SDLC bus interface panel 232 of NEMA-standard TS-2 traffic-control cabinet 106B, as shown. Power to energize card rack module 116 and master module 226 is preferably supplied by one or more wall-mounted transformers 214.

NEMA saw the need for a second version of the TS-2 standard to address legacy TS-1 hardware still in service. The second variant, known in the art as TS-2 type 2, includes updated TS-2 functionality, but maintains the round MS A, B, and C cabinet connectors of the older TS-1 standard. The preferred modular adapters 102 of traffic control expansion and testing system 100 are fully compatible with both TS-2 variants.

Figure 7:
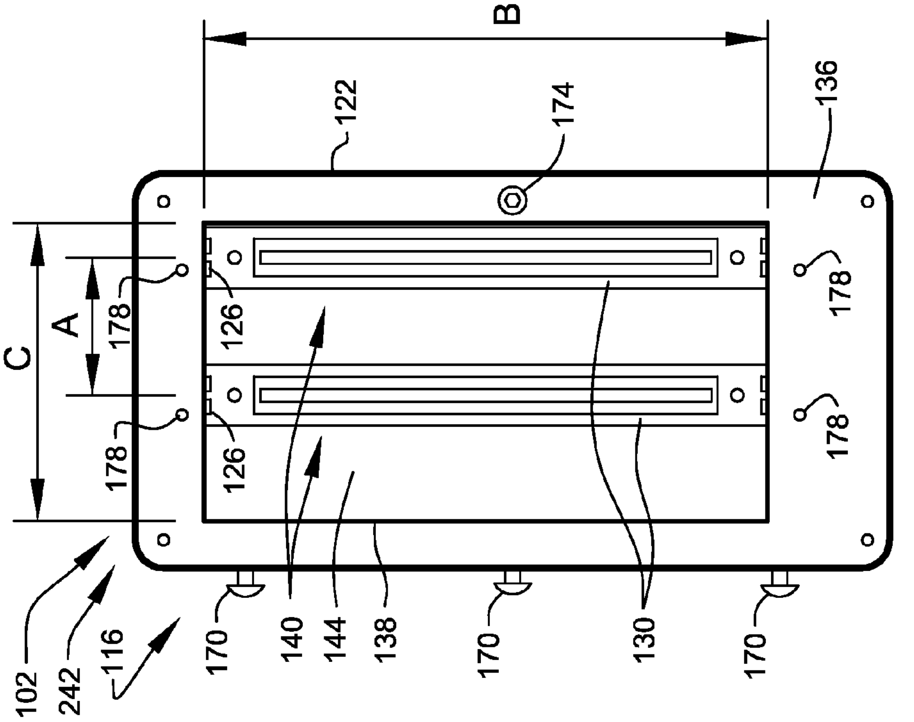
FIG. 7 shows a front elevational view of the modular adapter of FIG. 1.

FIG. 7 shows a front elevational view of card rack module 116. Visible in the illustration of FIG. 7 is front outer wall 136, card passageway 138, threaded sockets 178, and lock 174, In addition, guides 126, edge-connector sockets 130, and backplane 144 are visible through card passageway 138. Card passageway 138 comprises a preferred opening height B of about 4.5 inches and a preferred opening width C of about 2.35 inches.

FIG. 8 shows a rear elevational view of card rack module 116. Visible in the illustration of FIG. 8 is rear outer wall 137, signal-input coupler 145, signal-output couplers 146 (including the TS-1 signal-output coupler 146A and TS-2 SDLC coupler 146B), main-power switch 164, voltage-selector switch 167, and external-power coupler 152.

Signal-input coupler 145 preferably comprises a 25 pin D-sub connector, as shown. Signal-output coupler 146A preferably comprises a nine pin D-sub connector, preferably formatted to comprise eight signal outputs plus logic ground (see also FIG. 13). SDLC coupler 146B preferably comprises a 10/100 RJ-45 connector, as shown. Alternately preferably, SDLC coupler 146B comprises a nine pin D-sub connector, as shown in FIG. 13. Upon reading this specification, those with ordinary skill in the art will now appreciate that, under appropriate circumstances, considering such issues as advances in technology, updated standards, etc., other connector arrangements such as, for example, SDLC RS232, USB, HSSDC, Firewire, Ethernet, as of yet developed data-transfer protocols, etc., may suffice.

Voltage-selector switch 167 is preferably used to select between 24-volt DC TS-1 operation and 12-volt DC TS-2 operation. Voltage-selector switch 167 preferably comprises a double pole slide switch, while main-power switch 164 preferably comprises a single-pole slide switch.

Outer housing 122 preferably comprises an overall outer height D of about 6 inches and an overall outer width E of about 3 inches. Outer housing 122 preferably comprises a substantially metal construction capable of withstanding between about −40 to +165 degrees Fahrenheit. Alternatively preferably, outer housing 122 preferably comprises Acrylonitrile Butadiene Styrene (ABS) plastic capable of withstanding between about −10 to +160 degrees Fahrenheit.

Figure 9:
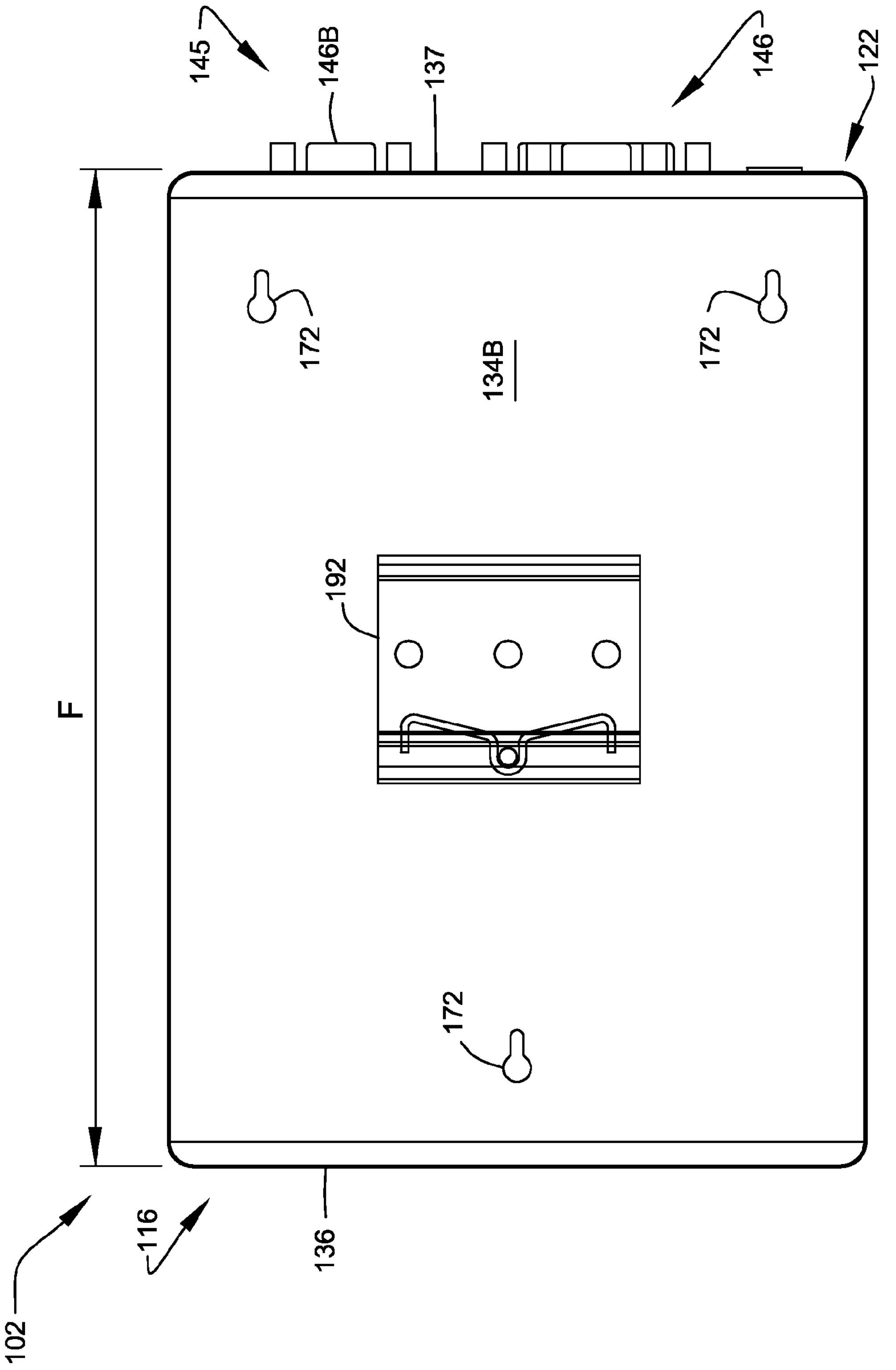
FIG. 9 shows a right side elevation view of the modular adapter of FIG. 1

FIG. 9 shows a right side elevation view of card rack module 116. Visible in the illustration of FIG. 9 is outer side wall 134B preferably containing three keyhole-shaped recessed sockets 172 of interlocker assembly 168. Outer housing 122 preferably comprises an overall outer length F of between about 7 inches and about 10 inches. The optional mounting bracket 192 is shown in a preferred installed position.

Figure 10:
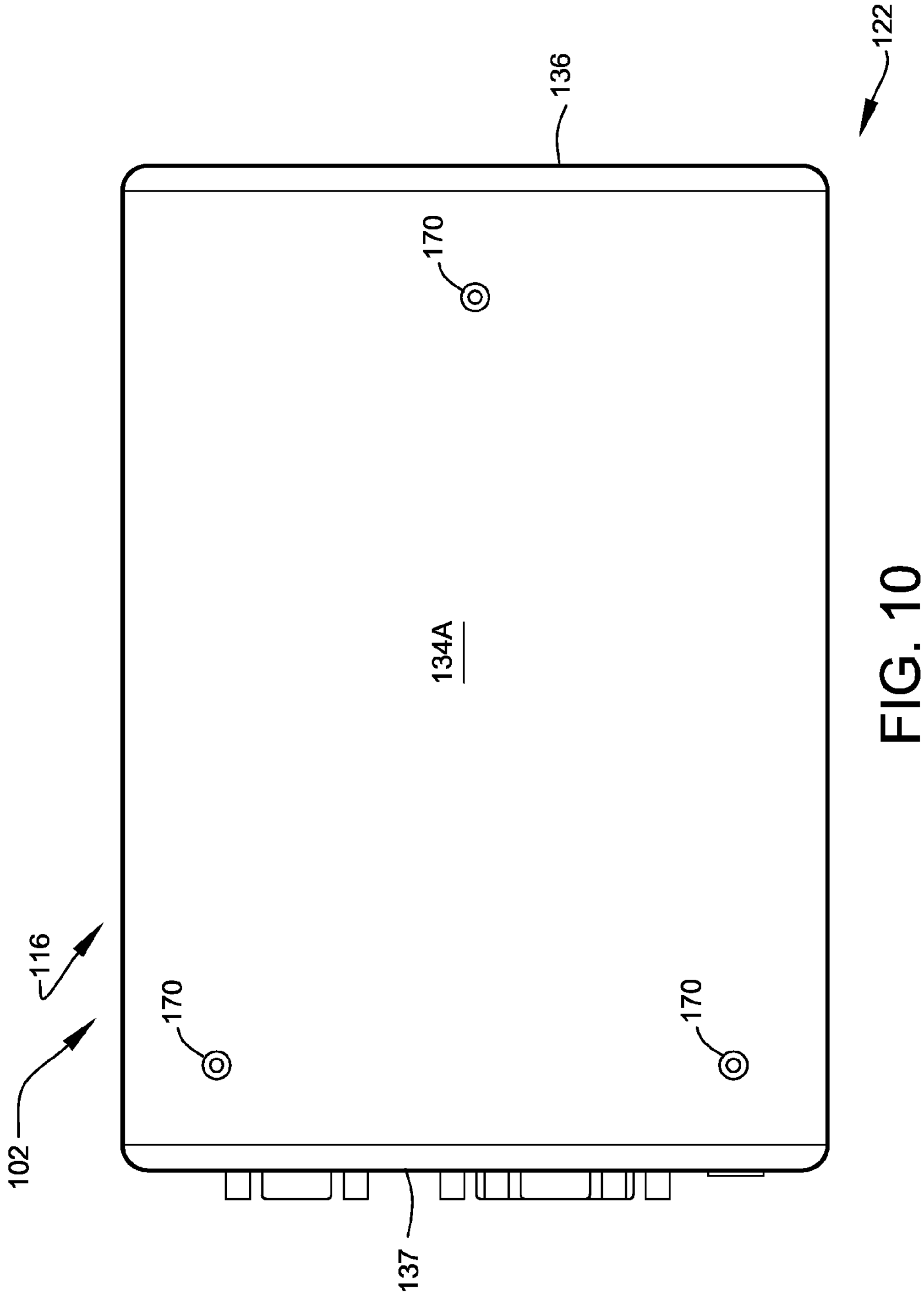
FIG. 10 shows a left side elevation view of the modular adapter of FIG. 1.

FIG. 10 shows a left side elevation view of the modular adapter of FIG. 1. Visible in the illustration of FIG. 10 is outer side wall 134A preferably containing three posts 170 of interlocker assembly 168.

Figure 11:
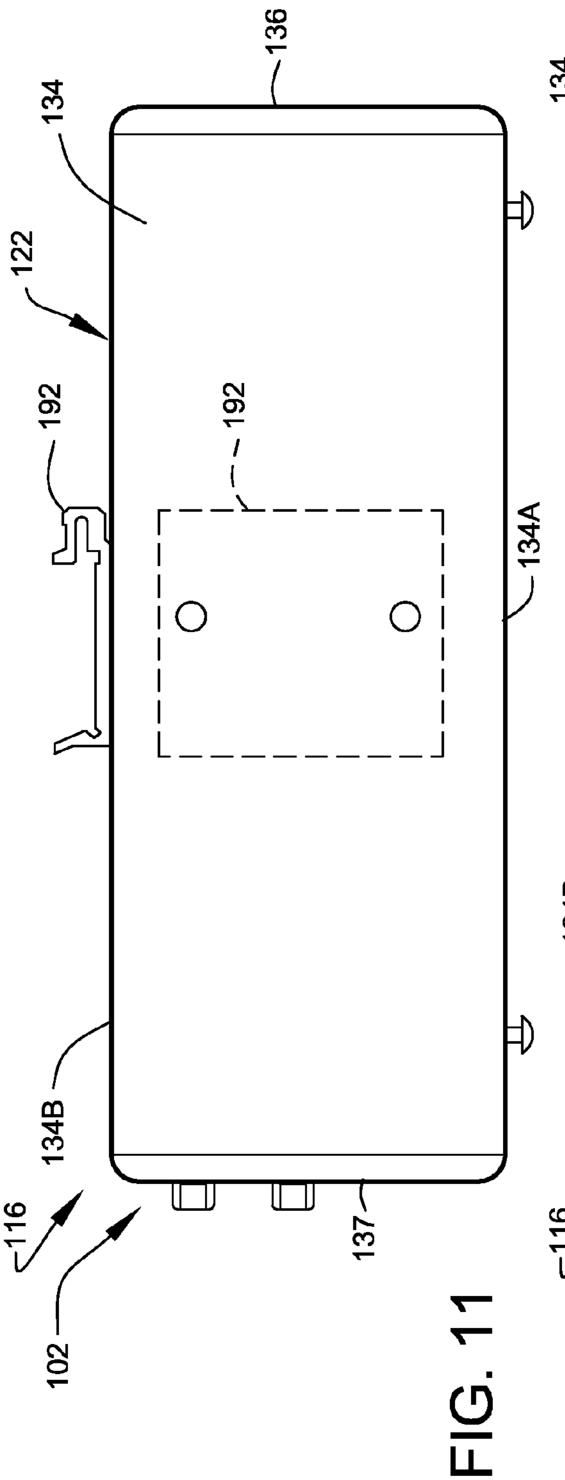
FIG. 11 shows a top view of the modular adapter of FIG. 1.
Figure 12:
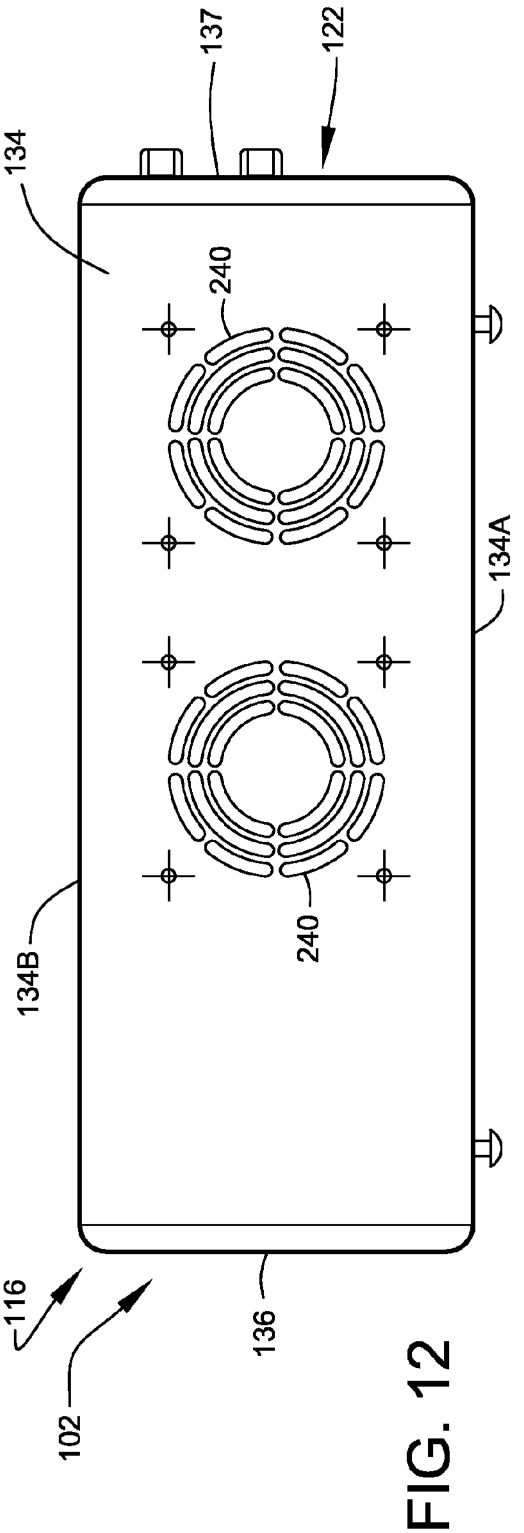
FIG. 12 shows a bottom view of the modular adapter of FIG. 1.

FIG. 11 shows a top view of card rack module 116 and FIG. 12 shows a bottom view of card rack module 116. Outer housing 122 preferably comprises one or more vent passages 240 to assist in venting interior compartment 124, as shown. In addition, alternate outer walls 134 may preferably be equipped to receive mounting bracket 192, as illustrated in the top view of FIG. 11.

FIG. 13 is a schematic circuit diagram illustrating preferred circuit arrangements of card rack module 116.

Figure 14:
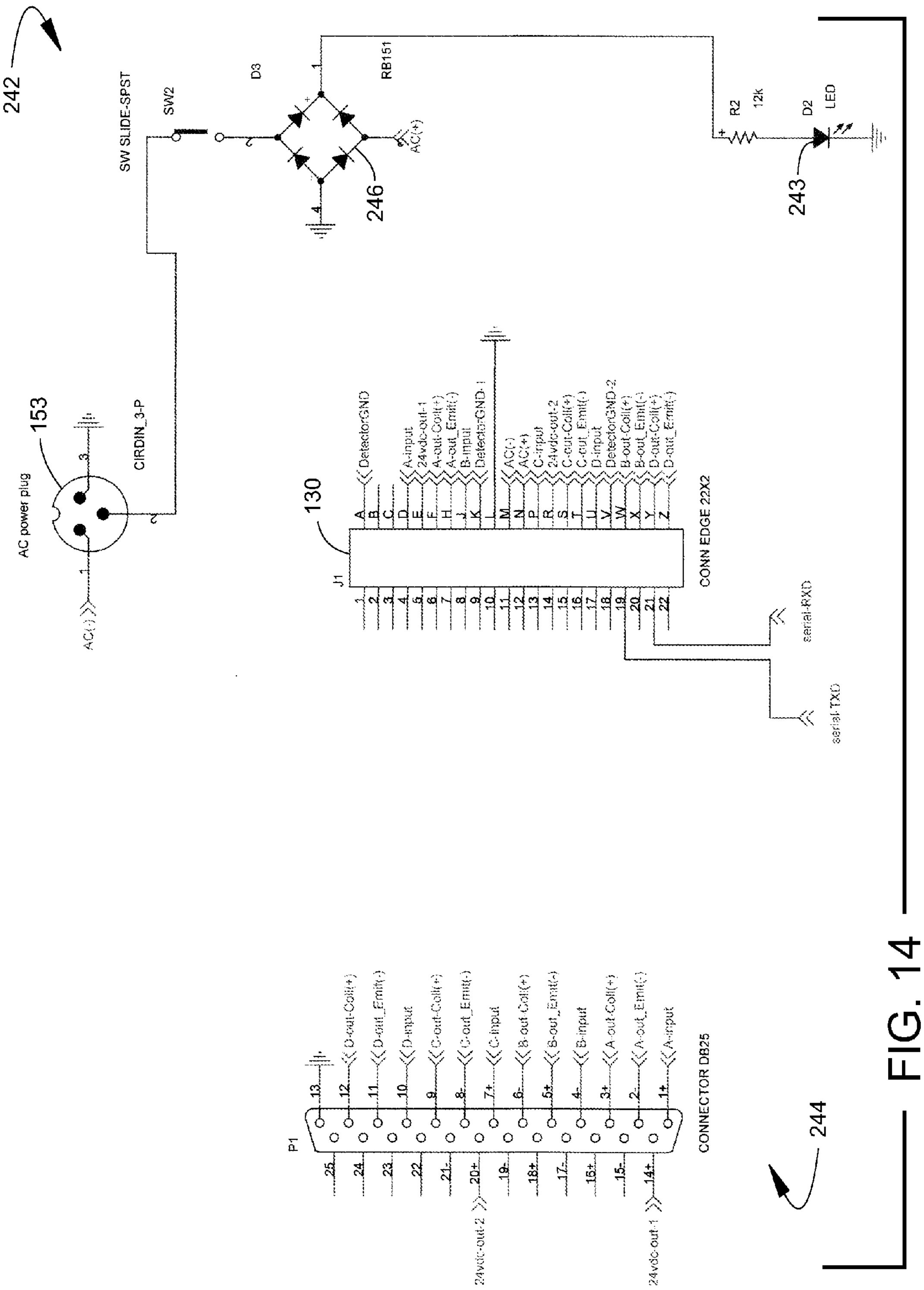
FIG. 14 is a schematic circuit diagram illustrating preferred circuit arrangements of an alternate modular adapter, according to another preferred embodiment of the present invention.

FIG. 14 is a schematic circuit diagram illustrating preferred circuit arrangements of alternate modular adapter 242, preferably supporting the operation of a rack-mountable electronic card 112 having NEMA-type traffic signal preemption functionality, according to another preferred embodiment of the present invention. As previously noted, alternate modular adapter 242 is substantially similar to the housing structures and arrangements of card rack module 116; however, alternate modular adapter 242 preferably incorporates the alternate onboard electrical circuit 244, as depicted in FIG. 14. Onboard electrical circuit 244 preferably comprises an alternate external-power coupler 153 configured to receive line-voltage alternating current (AC) used by the NEMA-compliant preemption cards. Diode bridge 246 is preferably used in the depicted power circuit to provides the same polarity of output voltage for either polarity of input voltage. Switch SW2 is preferably used to provide user-controlled energizing of the unit while the LED indicator 243 preferably indicates the unit's operational status. Preferred pin assignments for edge-connector socket(s) 130 (P1) and port (J1) are as indicated in the schematic diagram.

Figure 16A:
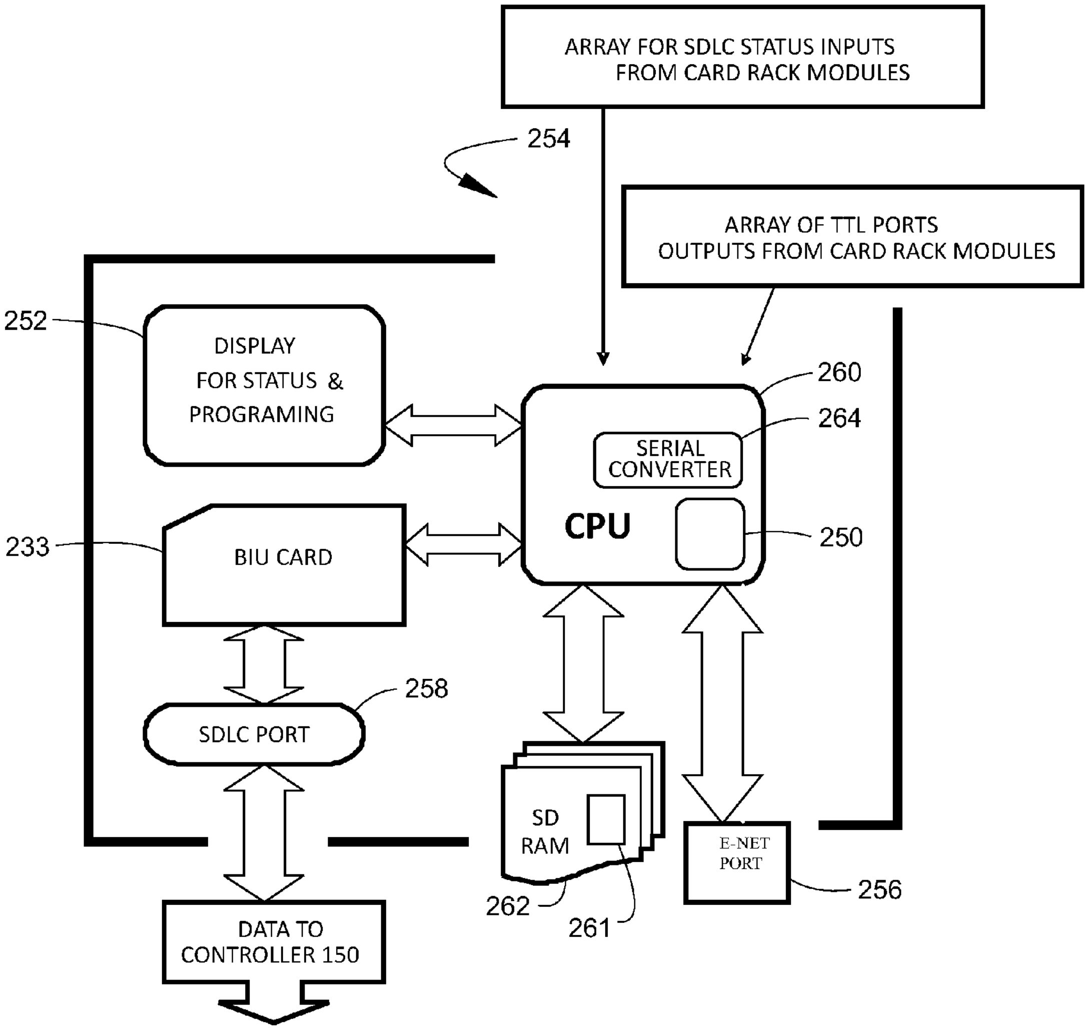
FIG. 16A shows a schematic block diagram illustrating a preferred hardware arrangement utilizing the master unit of FIG. 15A and FIG. 15B.
Figure 16B:
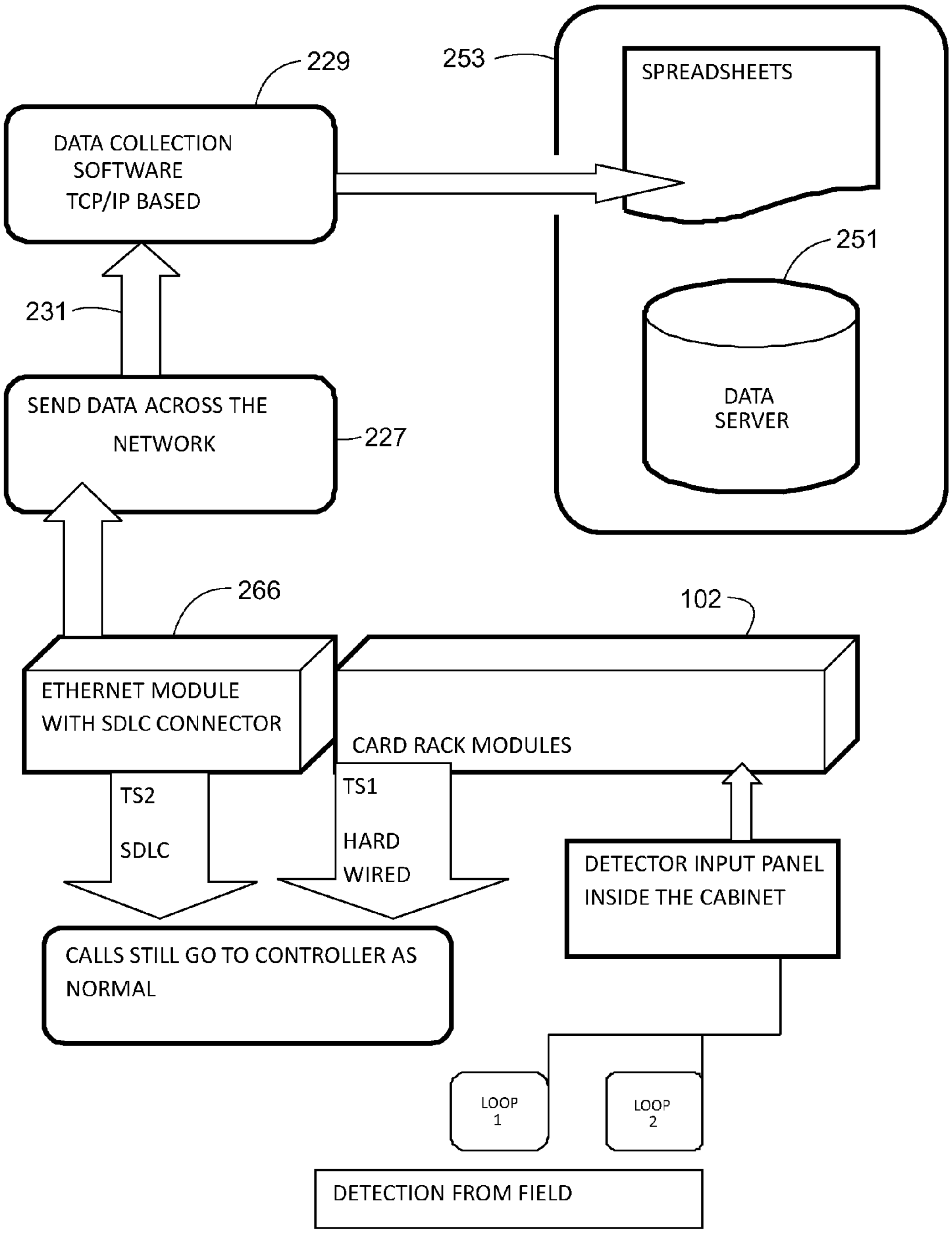
FIG. 16B shows a schematic block diagram illustrating a preferred network arrangement utilizing the master unit of FIG. 15A and FIG. 15B.

FIG. 15A shows a front elevational view of a modular network-communications adapter identified herein as master module 226, according to another preferred embodiment of the present invention. FIG. 15B shows a rear elevational view of master module 226. FIG. 16A shows a schematic block diagram illustrating preferred hardware and network-level arrangements of master module 226 of FIG. 15A and FIG. 15B. FIG. 16B shows a schematic block diagram illustrating preferred network communication and data-logging arrangements of master module 226 of FIG. 15A and FIG. 15B.

Master module 226 is preferably housed within a system-compatible enclosure substantially matching outer housing 122, as shown. Outer housing 122 of master module 226 preferably comprises display 252 for status and programming, communication ports 254 (preferably including a plurality of TS-2 interface ports 255 for transferring TS-2 status bits from the upstream components), and SDLC port 258, as shown. Both Ethernet port 256 and the TS-2 interface ports 225 preferably comprise 10/100 RJ-45 connectors, as shown.

Preferably contained within outer housing 122 is electronic circuitry enabling the preferred functions of master module 226. This electronic circuitry preferably includes; at least one computer processor 260 preferably interoperating with memory storage 262 (e.g., SD RAM), a serial data converter 264, I/O communication ports 254, user interface and display 252, the onboard computer-bus interface unit 233, SDLC port 258, and network-communications adapter 250, as shown.

The main purpose for master module 226 is twofold; to provide a BIU interface supporting card rack modules 116, and to bring detector data back to a central network server 253 (or network client) for collection or review (at least embodying herein at least one network protocol data stream external of the aging fixed-size traffic-control cabinet). This enhanced functionality preferably enables any overseeing agency with any common "brand-x" detection system to acquire data collection for a fraction of the cost of customary traffic-management centers.

In preferred operation master module 226 is physically tied in parallel to the existing detection system in traffic-control cabinet 106, as shown. In this preferred arrangement, all detection calls that normally go into existing electronic controller 150 are preferably copied or cloned to master module 226, as shown. Internal preprogrammed software 261, preferably operating on computer processor 260, is preferably configured to generate time stamps, dates, and organize all detections received by master module 226. Preferably, modular network-communications adapter 250 will then send that data across network 227, preferably using Internet Protocol Suite (commonly known as TCP/IP), through at least one existing network communication line 231. Preferred existing network communication lines 231 may comprise an accessible Ethernet backbone the overseeing agency has in place, preferably a Fiber run, alternately preferably, a VHDSL (Very High Bitrate DSL) line, alternately preferably, an Internet protocol wireless radio, etc. Once the TCP/IP data is received by network server 253 (or network client), the incoming data is processed by collection software 229, as shown. The data can then be stored in a spreadsheet or data server 251 for future use or reviewed in "real time" with analyzing software.

Figure 17:
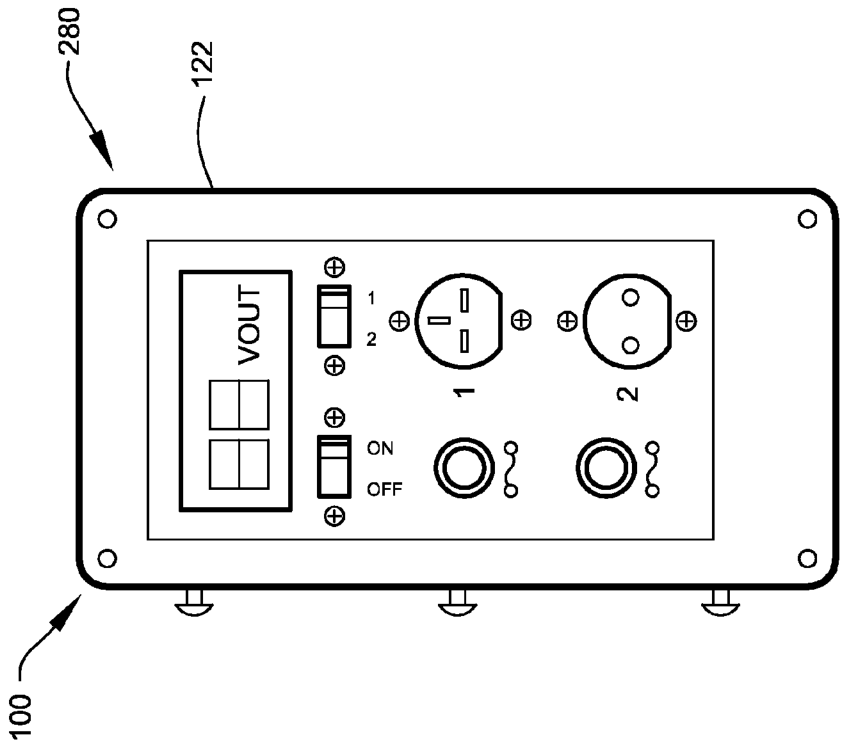
FIG. 17 shows a front elevational view of a modular power module, according to another preferred embodiment of the present invention.

FIG. 17 shows a front elevational view of modular power module 280, according to another preferred embodiment of the present invention. Modular power module 280 is preferably housed within a system-compatible enclosure substantially matching outer housing 122, as shown. Modular power module 280 is preferably structured and arranged to provide regulated electrical power to at least one traffic-signal component within traffic-control cabinet 106. Modular power module 280 is preferably used where non-standard or specialized power is required for the installation, as may occur when using embodiments of the system outside North America. Upon reading this specification, those with ordinary skill in the art will now appreciate that, under appropriate circumstances, considering such issues as intended use, safety, prevailing regulations, etc., other power arrangements such as, for example, using a modular power module as an uninterrupted power supply for the existing rack-mounted devices, etc., may suffice.

Figure 18:
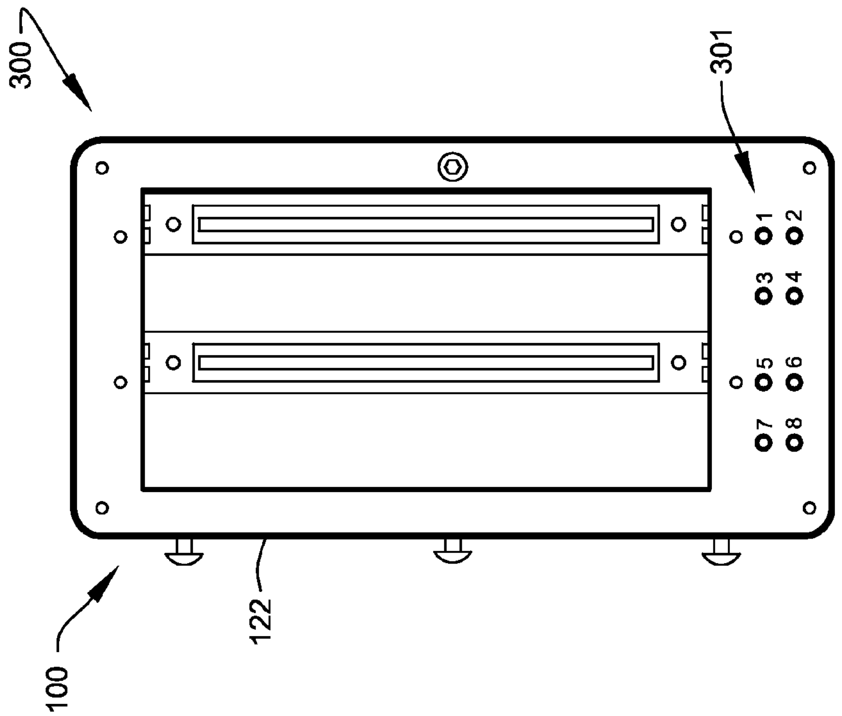
FIG. 18 shows a front elevational view of a modular testing unit used to test the functioning of at least one rack-mountable electronic card unit, according to another preferred embodiment of the present invention.

FIG. 18 shows a front elevational view of modular testing unit 300 used to test the functioning of at least one rack-mountable electronic card unit, according to another preferred embodiment of the present invention. Most jurisdictional agencies governing the operation of traffic-control cabinets establish regular intervals for preventive cabinet maintenance. Modular testing unit 300 is preferably designed to assist traffic-control technicians complete field maintenance and trouble-shooting operations. Preferably, modular testing unit 300 can be used in the field to power up rack-mountable electronic card 112 that need software configuration or upgrading; such external power preferably provided by native vehicle DC voltages or by a low-voltage wall-transformer. Modular testing unit 300 is also useful in assisting technician training.

Modular testing unit 300 preferably comprises the same structures and arrangements as those of card rack module 116, as shown. In addition, modular testing unit 300 is preferably equipped with a set of front-panel indicator lights 301 to provide a visual status of the functioning of rack-mountable electronic cards coupled to the unit. Referring again to the schematic circuit diagram of FIG. 13, positive lead 160 within modular testing unit 300 is preferably split to supply testing sub circuit 155, as shown. Switch 298 (SW3) of testing sub circuit 155 preferably comprises an optional branch circuit supporting on-board testing of a rack-mountable electronic card engaged within edge-connector socket 130. FIG. 13 shows one of the eight preferred indicator segments, each one comprising a 3-Terminal positive voltage regulator 302, a single LED 304 preferably controlled by a general-purpose PNP silicon transistor 306, the base pin of transistor 306 preferably coupled to an appropriate respective electrical conductor of onboard electrical circuit 148, as shown. A preferred voltage regulator suitable for use as voltage regulator 302 includes model LM7805 as produced by, for example, Fairchild Semiconductor of San Jose Calif. A preferred general-purpose transistor suitable for use as transistor 306 includes model 2N4033 as produced by, for example, Siemens Semiconductor USA. In-series resistors provide appropriate current control within the test circuit.

Figure 19:
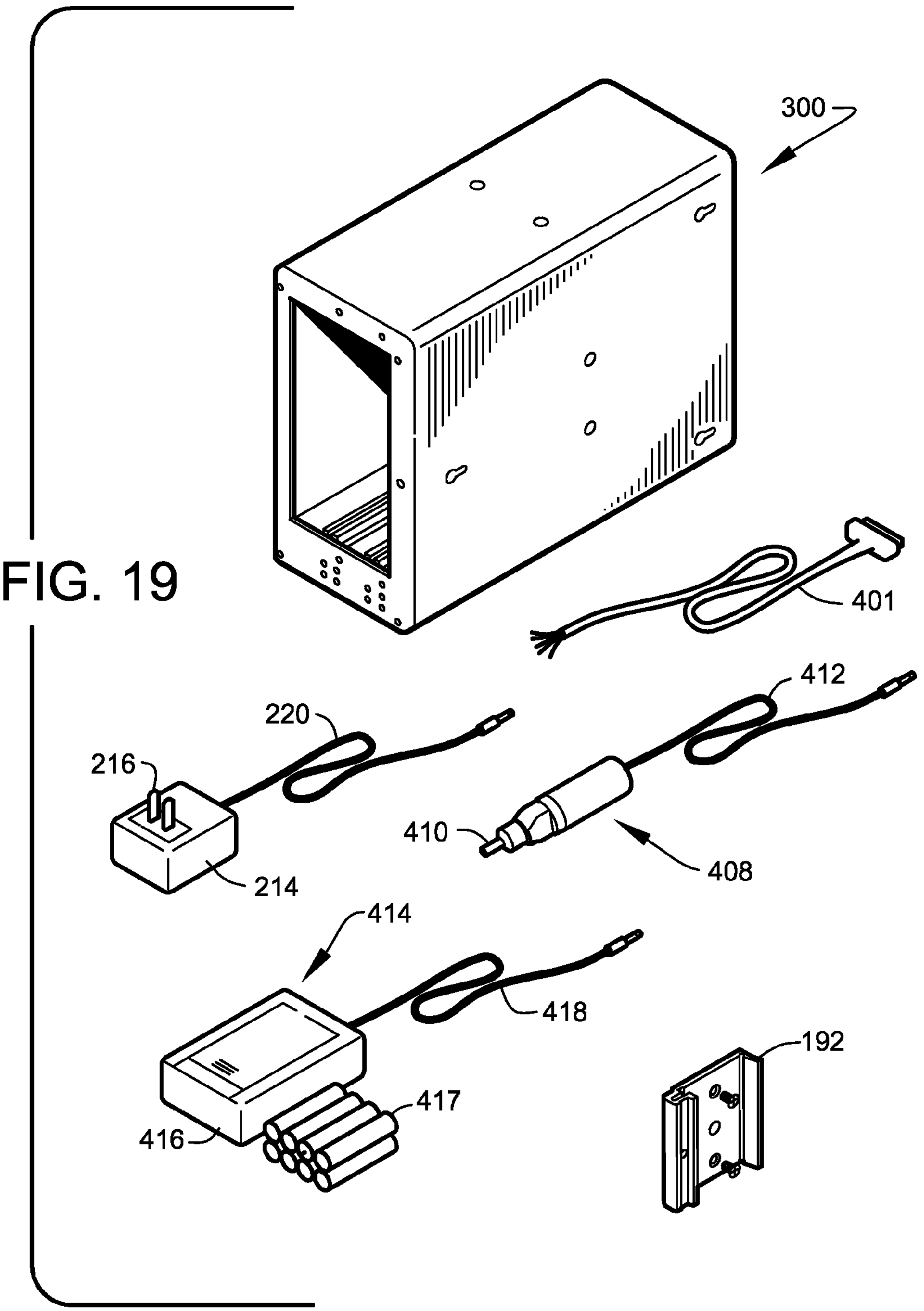
FIG. 19 shows a schematic depiction of preferred components making up a testing kit, according to another preferred embodiment of the present invention.

The preferred small size and light weight of modular testing unit 300 (preferably about 1 pound) allows a technician to use modular testing unit 300 to test any NEMA standard TS-1, TS-2, 170, & 2070 detector card, wherever the technician may be located. Modular testing unit 300 is preferably configured to operate using substantially any 12 volt or 24-volt DC source, preferably including a vehicle cigarette lighter (preferably using accessory-power-outlet adapter 408 as shown in FIG. 19) or alternately preferably, a wall outlet using low-voltage wall transformer 214. When a detector-type rack-mountable electronic card 112 is installed in either of the two card slots 140 of modular testing unit 300, there are at least three preferred tests that can be done to determine if a card is functioning properly.

The first test can be done on a TS-2 compatible card with the power turned off. The NEMA TS-2 standard requires all detector cards to default to a fault state, which requires the card to generate constant calls, whenever power to the card is lost. Modular testing unit 300 is preferably designed to light up all applicable front-panel indicator lights 301 when a power-loss condition occurs. In such preferred operation, a two-channel rack-mountable electronic detector card 112 placed in the first card slot 140 will preferably activate the first two LEDs 304 in the first row of front-panel indicator lights 301, and a 4-channel detector card in the second edge-connector socket 130 will preferably light up all four LEDs 304 of the second row of the front-panel indicator lights 301.

The second preferred test is done while power is applied to a rack-mountable electronic detector card. All NEMA detector cards are required to comprise a means for placing the card in a "Locking" or "Fault" state. Modular testing unit 300 preferably exploits this feature to verify the rack-mountable electronic detector card place calls as intended. It is noted that most NEMA cards current comprise LEDs to represent both a Normal call and a Fault condition.

The third preferred test requires the optional call generator module to insert calls through the backplane of Modular testing unit 300 to simulate call conditions from the field. This test preferably ensures that all stages of the rack-mountable electronic detector card have been tested.

Programming of rack-mountable electronic detector cards is preferably performed using at least one external testing computer interfaced with a detector card using one of the signal-output couplers 146 (at least embodying herein at least one data-interface coupler structured and arranged to be connectably interfaced with the at least one data communication port of at least one external testing computer).

FIG. 19 shows a diagrammatic depiction of preferred components making up testing kit 400, according to another preferred embodiment of the present invention. Testing kit 400 preferably comprises at least one modular testing unit 300, at least one interface cable 401 (signal-input cable 211, signal-output cable 213, etc.), at least one external power source 402 to supply operable electrical power to external-power coupler 152, and at least one set of operating instructions 404 to assist a technician in using modular testing unit 300 to test rack-mountable electronic cards.

In a preferred embodiment of testing kit 400, external power source 402 preferably comprises an AC-DC wall transformer 214, as shown (at least embodying herein at least one alternating current to direct current electrical transformer structured and arranged to transform line voltage alternating current to reduced voltage direct current; wherein such at least one alternating current to direct current electrical transformer comprises at least one male plug portion structured and arranged to be pluggable into a conventional line-voltage alternating current receptacle, and at least one corded coupler structured and arranged to couple the reduced voltage direct current to such at least one external-power coupler).

In another preferred embodiment of testing kit 400, external power source 402 preferably comprises vehicle-accessory power outlet adapter 408, as shown. Vehicle-accessory power outlet adapter 408 is preferably structured and arranged to receive electrical current from an accessory power receptacle of a vehicle. This preferred kit power source allows a technician to perform testing within the protected interior of a vehicle, away from traffic noise, inclement weather, or other site-related hazards.

Vehicle-accessory power outlet adapter 408 preferably comprises male plug portion 410, preferably configured to be pluggable into at least one vehicular-accessory power receptacle, and a corded coupler 412 structured and arranged to couple electrical current from the receptacle to external-power coupler 152. Upon reading this specification, those with ordinary skill in the art will now appreciate that, under appropriate circumstances, considering such issues as vehicle type, availability of power outlets, etc., other vehicle power arrangements such as, for example, utilizing “jumper”-type alligator clips, dedicated vehicle power outlets, etc., may suffice.

In another preferred embodiment of testing kit 400, external power source 402 preferably comprises at least one battery power source 414 structured and arranged to provide electrical current from one or more current-producing electrical batteries 417. Battery power source 414 preferably comprises battery holder 416 (at least embodying herein at least one battery engager) to hold, and electrically engage, the bank of batteries 417 contained therein. Corded coupler 418 is preferably coupled to battery holder 416, and preferably functions to couple the DC electrical current, produced by the batteries, to external-power coupler 152. Upon reading this specification, those with ordinary skill in the art will now appreciate that, under appropriate circumstances, considering such issues as cost, user preference, etc., other battery holder arrangements such as, for example, weather proof housings, recharging ports, charge indicators, voltage regulators, solar recharging panels, etc., may suffice.

Preferred embodiments of testing kit 400 may preferably comprise combinations of the above described external power sources 402. It is further noted that modular testing unit 300 may be permanently mounted within a cabinet, preferably using shelf mounting or alternately preferably rail-mounting bracket 192, so as to function as both a testing unit and means for expanding detection channel capacity.

Figure 20:
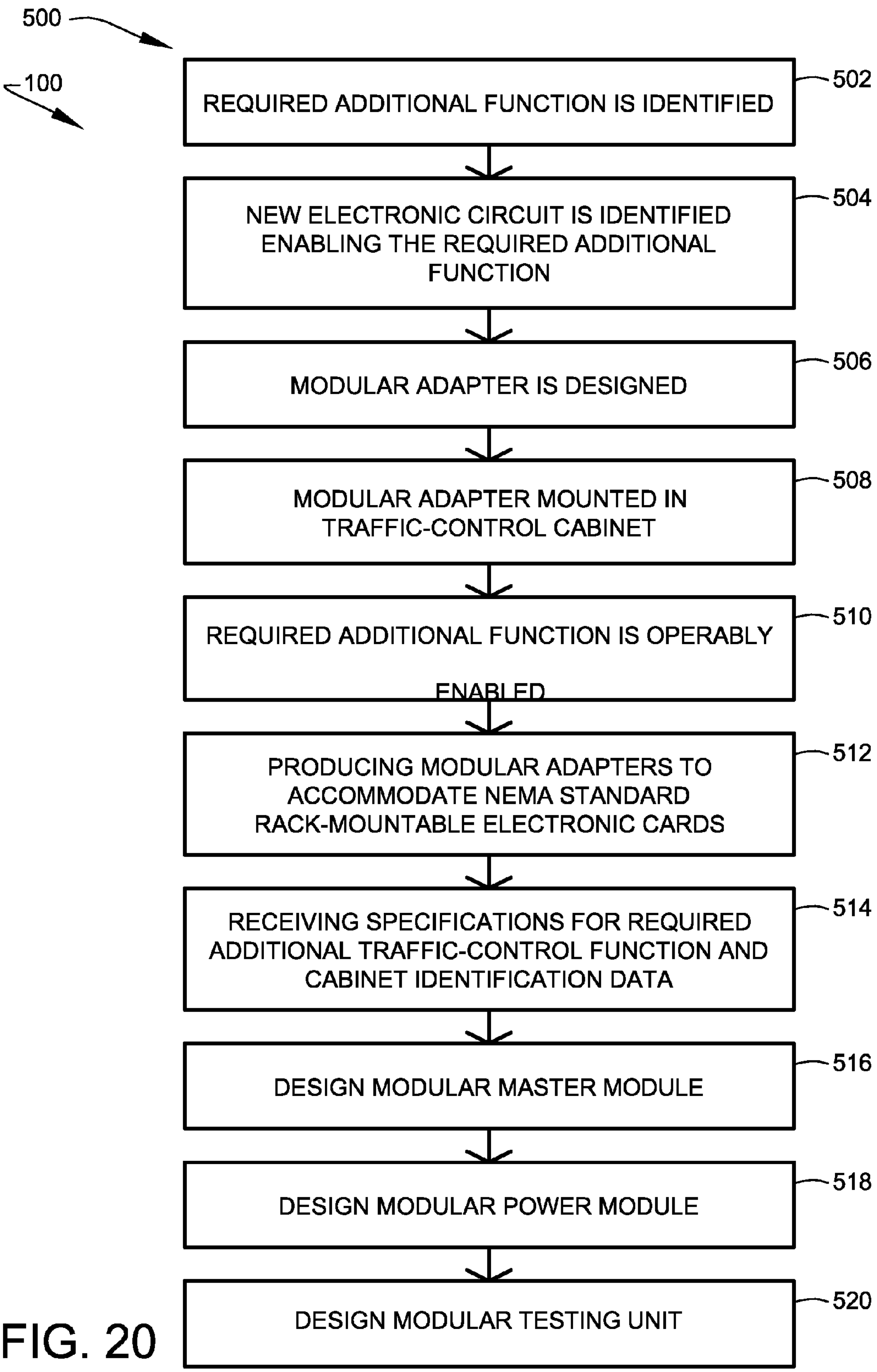
FIG. 20 is a flow diagram generally illustrating a preferred method related to extending the service life of a plurality of aging fixed-size traffic-control cabinets, within at least one traffic-control network, according to a preferred method of the present invention.

FIG. 20 is a flow diagram generally illustrating preferred method 500 related to extending the service life of a plurality of aging fixed-size traffic-control cabinets 106, within at least one traffic-control network, according to a preferred method of traffic control expansion and testing system 100.

In the initial preferred step 502 of method 500, at least one required additional function is identified to extend the service life of an aging fixed-size traffic-control cabinet 106 of a plurality of aging fixed-size traffic-control cabinets. Such at least one required additional function may preferably include additional detection, additional monitoring, preemption, etc. Next, as depicted in preferred step 504, at least one new electronic circuit is identified enabling the required additional function when integrated within traffic-control cabinet 106. This preferably includes the identification and selection of one or more NEMA-type traffic signal detector cards, NEMA-type traffic signal preemption cards, computer-bus interface units 233, modular network-communications adapters, power supplies, etc. Next, at least one modular adapter 102 is preferably designed capable of adapting the at least one new electronic circuit or circuits to interoperate with traffic-control cabinet 106, as depicted in preferred step 506. The modular adapter 102 of preferred step 506 preferably comprises card rack module 116, master module 226, or other modular embodiment of traffic control expansion and testing system 100.

Next, as indicated in preferred step 508, modular adapter 102 is preferably mounted in traffic-control cabinet 106. The preferred structures and arrangements of modular adapter 102 allow such installation substantially without removal or replacement of existing components of traffic-control cabinet 106. Next, as indicated in preferred step 510, the required additional function is operably enabled within traffic-control cabinet 106, preferably by electrically coupling the new electronic circuit, card, etc., to the electrical circuits of traffic-control cabinet 106 via modular adapter 102. The above-described preferred series of steps effectively extends the service life of the aging fixed-size traffic-control cabinet 106 an appreciable time without removal or replacement of existing components.

In addition, method 500 comprises the subsequent preferred step 512 of producing modular adapters 102 to accommodate NEMA standard rack-mountable electronic cards 112, as generally described in FIG. 1 through FIG. 14. Step 512 preferably includes: designing compatible card slots 140, providing edge-connector socket 130, formatting the signal output couplers to comprise signal-transmission formats compatible the NEMA components, providing appropriate signal-transmission circuits within onboard electrical circuit 148, designing at least one modular adapters 102 capable of adapting NEMA-type traffic signal detector cards to interoperate with traffic-control cabinet 106, designing at least one modular adapters 102 capable of adapting NEMA-type traffic signal preemption cards to interoperate with traffic-control cabinet 106, providing at least one supportive outer housing 122 comprising interlocker assembly 168, etc.

In addition, method 500 comprises the preferred step 514 of receiving from at least one municipality, governing the operation of at least one traffic-control network, at least one specification for the at least one required additional traffic-control function to be added to one or more traffic-control cabinets 106 of the network. It is noted that, preferred step 514 may further preferably comprise: receiving from the municipality, identification of the specific aging fixed-size traffic-control cabinets 106 to be retrofitted with the new required additional function.

In addition, method 500 comprises the preferred step 516 of designing a modular master module 226 to provide both a communication interface between NEMA standard rack-mountable electronic cards 112 and existing computer data bus 118 and data communication between traffic-control cabinet 106 and at least one network protocol data stream external of the aging fixed-size traffic-control cabinet. Furthermore, method 500 comprises the preferred step 518 of designing a modular power module 280 structured and arranged to provide electrical power to at least one electrical device of traffic-control cabinet 106.

In addition, method 500 comprises the preferred step 520 of designing a modular testing unit 300 to provide a visual status of the functioning of rack-mountable electronic card 112 when coupled to edge-connector socket(s) 130 of modular testing unit 300.

Although applicant has described applicant's preferred embodiments of this invention, it will be understood that the broadest scope of this invention includes modifications such as diverse shapes, sizes, and materials. Such scope is limited only by the below claims as read in connection with the above specification. Further, many other advantages of applicant's invention will be apparent to those skilled in the art from the above descriptions and the below claims.

What is claimed is:

1. A method of extending the service life of a plurality of aging fixed-size traffic-control cabinets, within at least one traffic-control network, comprising the steps of:

a) identifying at least one required additional function to extend the service life of at least one aging fixed-size traffic-control cabinet of such plurality of aging fixed-size traffic-control cabinets;

b) identifying at least one new electronic circuit enabling the at least one required additional function when integrated within the at least one aging fixed-size traffic-control cabinet;

c) designing at least one modular unit capable of adapting the at least one new electronic circuit to interoperate with the at least one aging fixed-size traffic-control cabinet, such at least one modular unit comprising i) at least one circuit support structured and arranged to mechanically support the at least one new electronic circuit, ii) at least one signal-input coupler structured and arranged to assist electrical coupling of the at least one new electronic circuit to at least one signal input from at least one traffic-control device, iii) at least one signal-output coupler structured and arranged to assist electrical coupling of at least one signal output of the at least one new electronic circuit to at least one existing electrical circuit of the at least one aging fixed-size traffic-control cabinet, iv) at least one direct support-to-support interlocker structured and arranged to directly interlock such at least one circuit support to at least one other at least one circuit support of at least one other modular unit, and v) at least one mount structured and arranged to assist mounting of such at least one circuit support within the at least one aging fixed-size traffic-control cabinet;

d) mounting such at least one modular unit within the at least one aging fixed-size traffic-control cabinet substantially without removal or replacement of existing components of the at least one aging fixed-size traffic-control cabinet; and e) operably enabling such at least one required additional function within the at least one aging fixed-size traffic-control cabinet by electrically coupling the at least one new electronic circuit to the at least one existing electrical circuit of the at least one aging fixed-size traffic-control cabinet using such at least one signal-input coupler and such at least one signal-output coupler of such least one modular unit;

f) wherein the service life of the at least one aging fixed-size traffic-control cabinet is extended an appreciable time without removal or replacement of existing components.

2. The method according to claim 1 further comprising the steps of:

a) designing such at least one circuit support to removably support at least one rack-mountable electronic card unit comprising the at least one new electronic circuit;

b) providing at least one card coupler structured and arranged to electrically couple to at least one electronic-signal connector of the rack-mountable electronic card when removably supported within such at least one circuit support;

c) formatting such at least one signal output coupler to comprise at least one signal-transmission format compatible with the establishing of at least one operable signal link between the at least one the rack-mountable electronic card unit and at least one existing electronic controller of the at least one existing electrical circuit; and d) providing at least one signal-transmission circuit structured and arranged to form at least one signal-transmission link between such at least one card coupler, such at least one signal-input coupler, and such at least one signal-output coupler.

3. The method according to claim 2 further comprising the step of designing at least one modular unit capable of adapting at least one NEMA-type traffic signal detector card to interoperate with the at least one aging fixed-size traffic-control cabinet.

4. The method according to claim 2 further comprising the step of designing at least one modular unit capable of adapting at least one NEMA-type traffic signal preemption card to interoperate with the at least one aging fixed-size traffic-control cabinet.

5. The method according to claim 2 further comprising the steps of:

a) providing at least one supportive housing structured and arranged to supportively house such at least one circuit support, such at least one card coupler, such at least one signal-transmission circuit, such at least one signal-input coupler, such at least one signal-output coupler, and such at least one mount; and b) joining such at least one direct support-to-support interlocker to such at least one supportive housing in at least one interlockable position allowing such direct support-to-support interlocking.

6. The method according to claim 5 further comprising the steps of:

a) providing at least one computer-bus interface circuit structured and arranged to interface logic signals generated by the new rack-mountable electronic card with at least one existing computer-data bus of the at least one existing electrical circuit;

b) arranging such at least one signal-output coupler to comprise at least one electronic-data-transmission format compatible with the establishing of at least one electronic-data-communication link between the at least one the rack-mountable electronic card unit and such at least one computer-bus interface circuit; and c) arranging such at least one signal-transmission circuit to form at least one compatible data-communication link between such at least one card coupler and such at least one signal-output coupler.

7. The method according to claim 6 further comprising the steps of:

a) providing at least one external-power coupler structured and arranged to couple such at least one new electrical circuit to at least one external source of electrical power;

b) providing at least one electrical-power formatter structured and arranged to format the at least one external source of electrical power, received at such at least one external power coupler, to provide formatted electrical power substantially matching at least one electrical power standard associated with the at least one new electronic circuit; and c) providing at least one formatted-power supply circuit structured and arranged to supply the formatted electrical power to the at least one new electrical circuit.

8. The method according to claim 7 further comprising the steps of:

a) receiving from at least one municipality, governing the operation of the at least one traffic-control network, at least one specification for the at least one required additional function to be added; and b) receiving from the at least one municipality, identification of the aging fixed-size traffic-control cabinet to be retrofitted to comprise the at least one required additional function.

9. The method according to claim 8 further comprising the steps of:

a) designing at least one modular unit to provide i) at least one computer-bus interface to interface logic signals generated by the new rack-mountable electronic card, ii) data communication between the aging fixed-size traffic-control cabinet and at least one network protocol data stream external of the aging fixed-size traffic-control cabinet, and iii) logging data sent by the aging fixed-size traffic-control cabinet and at least one network protocol data stream for later analysis.

10. The method according to claim 8 further comprising the step of designing at least one modular unit structured and arranged to provide electrical power to at least one electrical device of the aging fixed-size traffic-control cabinet.

11. The method according to claim 8 further comprising the step of designing at least one modular unit structured and arranged to provide a visual status of the functioning of the at least one rack-mountable electronic card unit when coupled to such at least one card coupler.

12. A system related to the functional integration of traffic-signal components, at least comprising at least one rack-mountable electronic card unit, within at least one existing computer-data bus of at least one existing traffic-control cabinet, such at least one existing computer-data bus configured to transfer data between such traffic signal components and at least one existing traffic-control computer, said system comprising:

a) at least one modular adapter structured and arranged to the functionally integrate at least one required additional function within the at least one existing traffic-control cabinet;

b) wherein said at least one modular adapter comprises i) at least one card support structured and arranged to removably support such at least one rack-mountable electronic card unit, ii) at least one card coupler structured and arranged to electrically couple to at least one card-interface connector of such at least one rack-mountable electronic card unit, iii) at least one signal-input coupler structured and arranged to assist electrical coupling of such at least one rack-mountable electronic card unit to at least one signal input from at least one traffic-control device, iv) at least one signal-output coupler structured and arranged to assist electrical coupling of at least one signal output of such at least one rack-mountable electronic card unit to the at least one existing computer data bus;

v) at least one signal-transmission circuit structured and arranged to transmit electronic signals between said at least one card coupler and said at least one signal-input coupler and said at least one signal-output coupler, vi) at least one direct interlocker structured and arranged to directly interlock said at least one card support to at least one other card support of said system, and vii) at least one mount structured and arranged to mount said at least one card support within the at least one existing traffic-control cabinet;

c) wherein such direct interlocking of said at least one card support to at least one other card support forms at least one interlocked card-supporting set; and d) wherein said at least one direct interlocker is further structured and arranged to allow disjoining of at least one said at least one card support from such at least one interlocked card-supporting set without disjoining all other said at least one card supports from such at least one interlocked card-supporting set.

13. The system according to claim 12 wherein said at least one signal-transmission circuit further comprises:

a) at least one external-power coupler structured and arranged to couple said at least one signal-transmission circuit to at least one external source of electrical power;

b) at least one electrical-power formatter structured and arranged to format the at least one external source of electrical power, received at said at least one external power coupler, to provide formatted electrical power substantially matching at least one electrical power standard associated with such at least one rack-mountable electronic card unit; and c) at least one formatted-power electrical pathway structured and arranged to supply the formatted electrical power to the at least one rack-mountable electronic card unit.

14. The system according to claim 13 wherein said at least one electrical-power formatter is structured and arranged to format such at least one external source of electrical power to providing an output voltage having a value selectable between about +12 volts direct current and about +24 volts direct current.

15. The system according to claim 13 further comprising at least one modular adapter capable of adapting at least one NEMA-type traffic signal detector card to interoperate with the at least one existing traffic-control cabinet.

16. The system according to claim 13 further comprising at least one modular unit capable of adapting at least one NEMA-type traffic signal preemption card to interoperate with the at least one existing traffic-control cabinet.

17. The system according to claim 13 further comprising:

a) at least one communication module structured and arranged to provide data communication between the at least one existing computer data bus and at least one network data device external of the at least one traffic-control cabinet;

b) wherein said at least one communication module comprises at least one direct interlocker structured and arranged to directly interlock said at least one communication module with at least one other direct interlocking modular component of said system.

18. The system according to claim 13 further comprising:

a) at least one power module structured and arranged to provide regulated electrical power to at least one of the traffic-signal components within the at least one existing traffic-control cabinet; and b) wherein said at least one power module comprises at least one direct interlocker structured and arranged to directly interlock said at least one communication module with at least one other direct interlocking modular component of said system.

19. The system according to claim 13 wherein said at least one card retainer further comprises:

a) at least one housing structured and arranged to supportively house the at least one rack-mountable electronic card unit;

b) wherein said at least one housing comprises i) at least one interior compartment structured and arranged to contain said at least one card coupler and said at least one electrical circuit, ii) at least one arrangement of outer walls structured and arranged to substantially enclose said at least one interior compartment, and iii) extending substantially through at least one outer wall of said at least one arrangement of outer walls, at least one card passageway structured and arranged to allow passage of the rack-mountable electronic card unit therethrough; and c) wherein said at least one arrangement of outer walls comprise said at least one signal-input coupler, said at least one signal-output coupler, said at least one direct support-to-support interlocker, said at least one external-power coupler, and said at least one mount.

20. The system according to claim 19 further comprising:

a) at least one visual status indicator structured and arranged to visually indicate functioning status of the at least one rack-mountable electronic card unit when coupled to said at least one card coupler;

b) wherein said at least one visual status indicator is mounted in at least one user-visible location within said at least one arrangement of outer walls.

21. The system according to claim 20 further comprising:

a) at least one alternating current to direct current electrical transformer structured and arranged to transform line voltage alternating current to reduced voltage direct current;

b) wherein said at least one alternating current to direct current electrical transformer comprises i) at least one male plug portion structured and arranged to be pluggable into a conventional line-voltage alternating current receptacle, and ii) at least one corded coupler structured and arranged to couple the reduced voltage direct current to said at least one external-power coupler.

22. The system according to claim 20 further comprising:

a) at least one vehicular-accessory power adapter structured and arranged to receive electrical current from at least one vehicle;

b) wherein said at least one vehicular-accessory power adapter comprises i) at least one male plug portion structured and arranged to be pluggable into at least one vehicular-accessory power receptacle, and ii) at least one corded coupler structured and arranged to couple the electrical current to said at least one external-power coupler.

23. The system according to claim 20 further comprising:

a) at least one battery power source structured and arranged to provide electrical current from at least one current-producing electrical battery;

b) wherein said at least one battery power source comprises i) at least one battery engager structured and arranged to electrically engage the at least one current-producing electrical battery, and ii) electrically coupled to said at least one battery engager, at least one corded coupler structured and arranged to couple the electrical current to said at least one external-power coupler.

24. A kit system related to onsite testing of individual traffic-signal components, at least comprising rack-mountable electronic card units, of at least one existing traffic-control cabinet, said kit system comprising:

a) at least one testing unit structured and arranged to test at least one operation of at least one such rack-mountable electronic card unit;

b) wherein said at least one testing unit comprises i) at least one card support structured and arranged to removably support such at least one rack-mountable electronic card unit, ii) at least one card coupler structured and arranged to electrically couple to at least one computer-data-bus connector of such at least one rack-mountable electronic card unit, iii) at least one data-interface coupler structured and arranged to be connectably interfaced with the at least one data communication port of at least one external testing computer, iv) at least one electrical circuit structured and arranged to transmit electronic signals between said at least one card coupler and said at least one data-interface coupler, v) at least one visual status indicator structured and arranged to visually indicate functioning status of the at least one rack-mountable electronic card unit when coupled to said at least one card coupler, and vi) at least one external-power coupler structured and arranged to couple the at least one rack-mountable electronic card unit to at least one external source of electrical power, c) at least one electronic interface cable to interface said at least one testing unit with at least one traffic-control device;

d) at least one external power source structured and arranged to supply operable electrical power to said external-power coupler; and e) at least one set of operating instructions to assist a user in testing the at least one rack-mountable electronic card unit using said at least one testing unit.

25. The kit system according to claim 24 wherein said at least one external power source comprises:

a) at least one alternating current to direct current electrical transformer structured and arranged to transform line voltage alternating current to reduced voltage direct current;

b) wherein said at least one alternating current to direct current electrical transformer comprises i) at least one male plug portion structured and arranged to be pluggable into a conventional line-voltage alternating current receptacle, and ii) at least one corded coupler structured and arranged to couple the reduced voltage direct current to said at least one external-power coupler.

26. The kit system according to claim 24 wherein said at least one external power source comprises:

a) at least one vehicular-accessory power adapter structured and arranged to receive electrical current from at least one vehicle;

b) wherein said at least one vehicular-accessory power adapter comprises i) at least one male plug portion structured and arranged to be pluggable into at least one vehicular-accessory power receptacle, and c) at least one corded coupler structured and arranged to couple the electrical current to said at least one external-power coupler.

27. The kit system according to claim 24 wherein said at least one external power source comprises:

a) at least one battery power source structured and arranged to provide electrical current from at least one current-producing electrical battery;

b) wherein said at least one battery power source comprises i) at least one battery engager structured and arranged to electrically engage the at least one current-producing electrical battery, and ii) electrically coupled to said at least one battery engager, at least one corded coupler structured and arranged to couple the electrical current to said at least one external-power coupler.

* * * * *